US011089698B2

(12) United States Patent
Monroe

(10) Patent No.: US 11,089,698 B2
(45) Date of Patent: Aug. 10, 2021

(54) RAPID ACCESS DISPLAY HOUSING

(71) Applicant: Dustin Monroe, Thornton, CO (US)

(72) Inventor: Dustin Monroe, Thornton, CO (US)

(73) Assignee: BSC ENCLOSURES, LLC, West Minster, CO (US)

( * ) Notice: Subject to any disclaimer, the term of this patent is extended or adjusted under 35 U.S.C. 154(b) by 0 days.

(21) Appl. No.: 16/819,019

(22) Filed: Mar. 13, 2020

(65) Prior Publication Data

US 2020/0329570 A1 Oct. 15, 2020

Related U.S. Application Data

(63) Continuation-in-part of application No. 16/382,003, filed on Apr. 11, 2019, now Pat. No. 10,638,083.

(51) Int. Cl.
*H05K 5/00* (2006.01)
*H04N 5/655* (2006.01)
*H05K 5/03* (2006.01)
*H05K 5/02* (2006.01)
*F16M 11/22* (2006.01)
*F16M 11/04* (2006.01)

(52) U.S. Cl.
CPC .......... *H05K 5/0017* (2013.01); *H04N 5/655* (2013.01); *H05K 5/0221* (2013.01); *H05K 5/0239* (2013.01); *H05K 5/03* (2013.01)

(58) Field of Classification Search
CPC ............ H04N 5/655; H04N 5/64; H04N 5/65; H05K 5/02; H05K 5/0017; H05K 5/0239; H05K 5/03; A47B 81/06; A47B 81/061; G09G 2300/02; G09G 2300/04
See application file for complete search history.

(56) References Cited

U.S. PATENT DOCUMENTS

| 8,169,553 | B2  |    5/2012 | Yamanaka |
|-----------|-----|-----------|----------|
| 8,231,017 | B2  |    7/2012 | Clontz |
| 8,279,359 | B2  |   10/2012 | Tanaka |
| 8,714,665 | B2  |    5/2014 | Campagna |
| 8,717,506 | B2* |    5/2014 | Austin ............... F16M 11/125 348/836 |
| 8,885,110 | B1* |   11/2014 | St. Clair ............... G06F 1/1654 348/836 |
| 9,041,867 | B2* |    5/2015 | Wu ....................... G06F 1/1601 348/836 |
| 2007/0030385 | A1  | 2/2007 | Crawford |
| 2007/0069973 | A1  | 3/2007 | Gerbacia |
| 2010/0228621 | A1  | 9/2010 | Hochhalter |
| 2017/0336833 | A1* | 11/2017 | Geary ................... G06F 1/1656 |

* cited by examiner

*Primary Examiner* — Alexander Gee
(74) *Attorney, Agent, or Firm* — Kyle W. Rost

(57) ABSTRACT

Two panels are assembled to form a housing by a face-to-face junction. Locking members are operated in pairs, with a first locking member of a pair operated to enable operation of the second locking member, which is preliminarily stopped before point of completion by contact with a pressure-alterable restriction. Hand pressure applied to the second locking member by-passes the restriction to complete assembly. One of the locking members can be readjusted using fasteners or is spring loaded to readjust itself when hand pressure is applied.

6 Claims, 9 Drawing Sheets

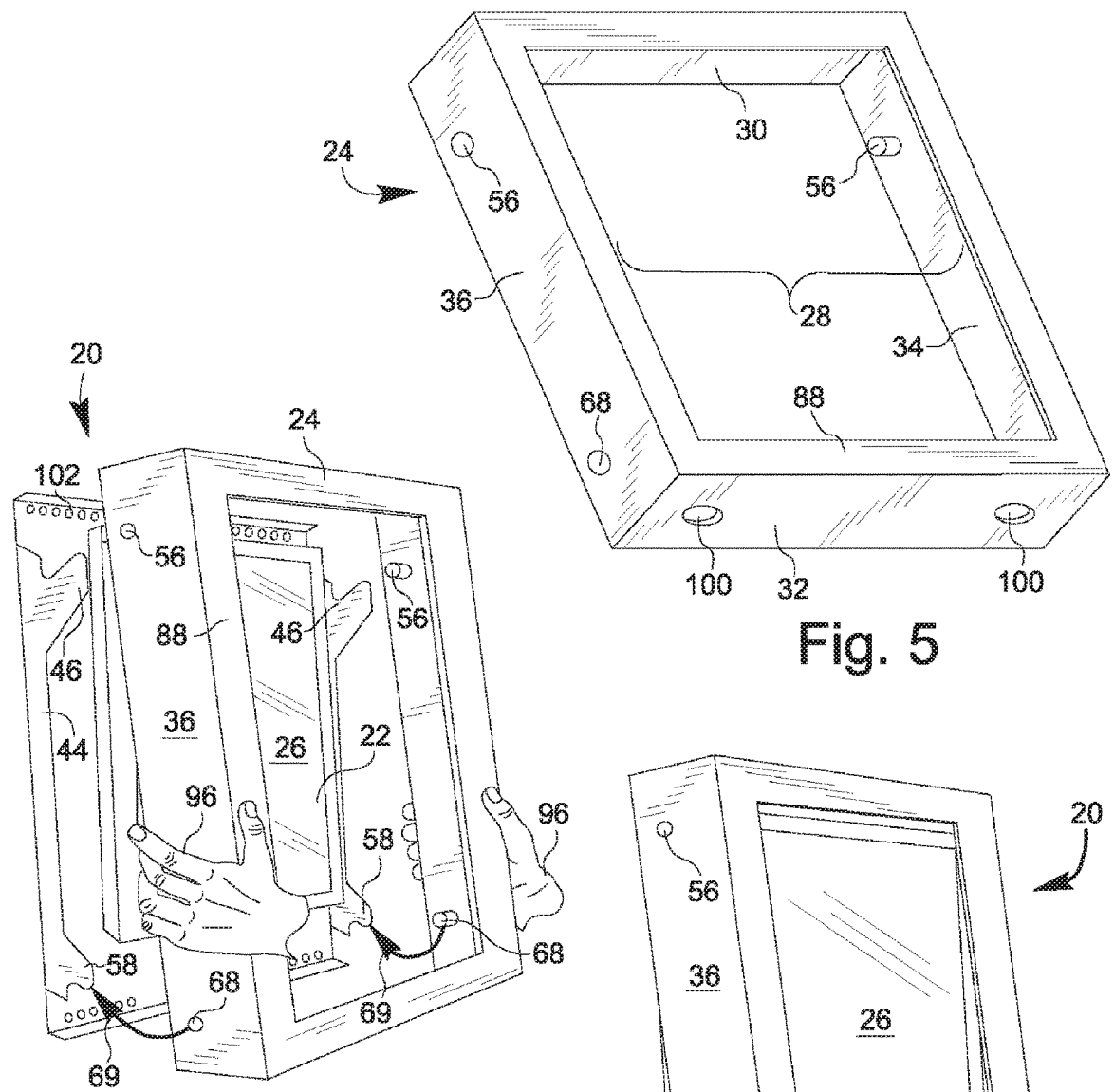
Fig. 5
Fig. 6
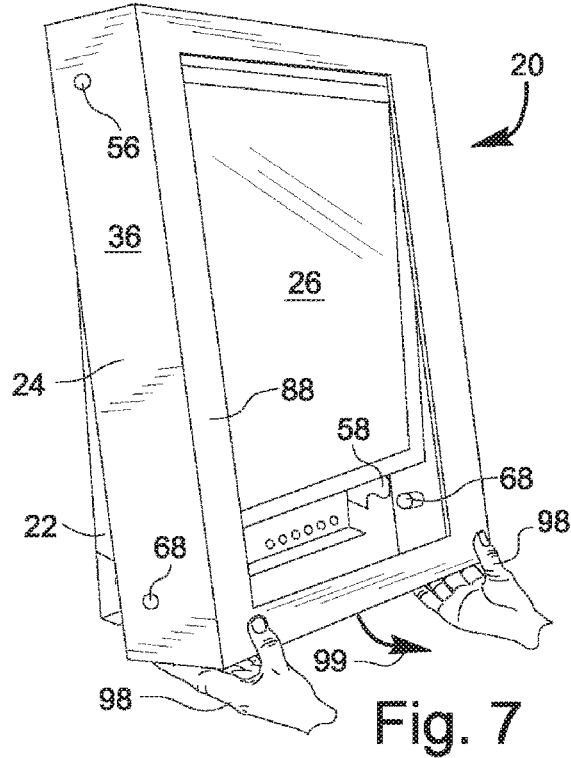
Fig. 7

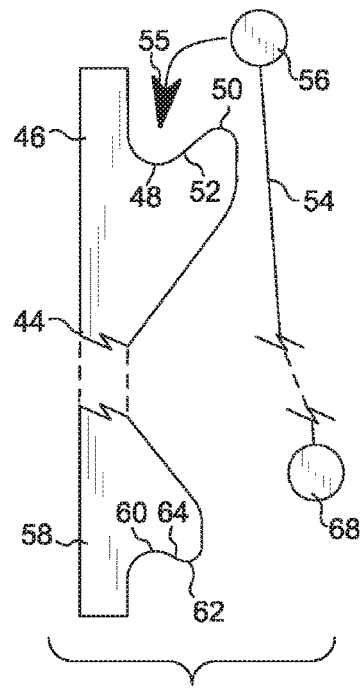 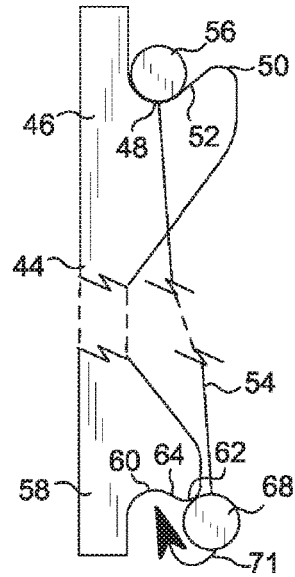 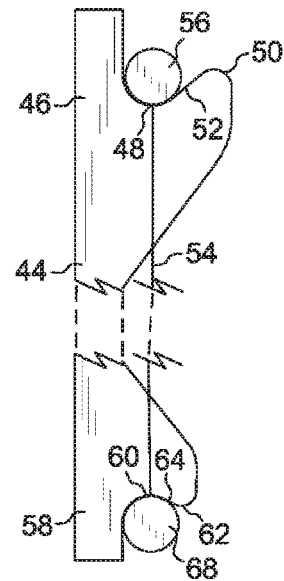
Fig. 8A  Fig. 8B  Fig. 8C
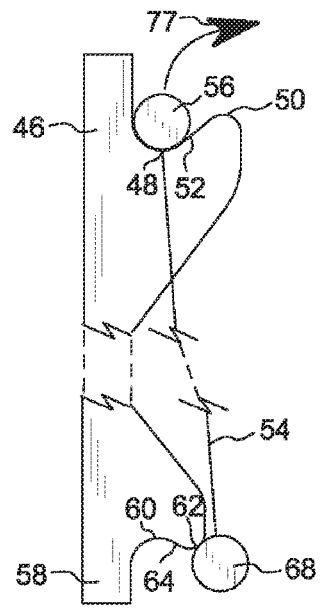 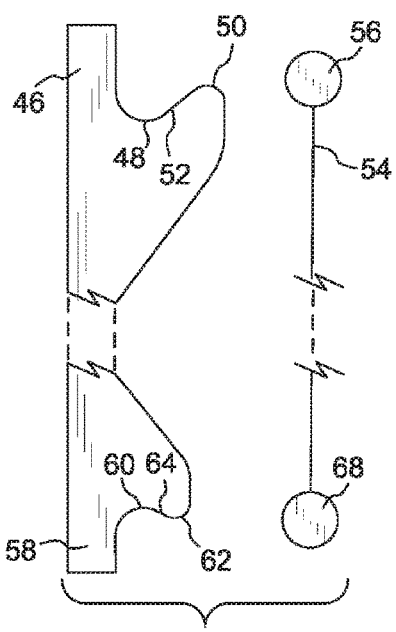 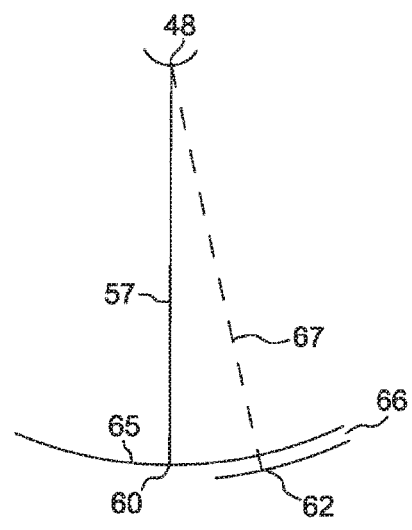
Fig. 8D  Fig. 8E  Fig. 8F

RAPID ACCESS DISPLAY HOUSING

BACKGROUND OF THE INVENTION

Field of the Invention

The invention broadly relates to television and more specifically to a cabinet or chassis or to a cabinet back. The invention also relates to pictorial communication and more specifically to constructional details of receivers, especially to cabinets or dust covers.

Description of Related Art Including Information Disclosed Under 37 CFR 1.97 and 1.98

For numerous applications it is desirable to employ an electronic video display unit, with or without audio. From an historical perspective, television and other video displays have employed a cathode ray tube (CRT). A typical CRT design employs a single electron beam. Some televisions and other types of display still employ this technology. However, the technology of the CRT carries limitations on the quality and utility of the display. Currently favored video display units employ a flat-panel display (FPD), which offers far larger screen sizes and higher resolution than is reasonably available in a CRT. In addition, a flat panel video display unit can be far thinner, lighter in weight, and more portable than a CRT of equal screen size. A variety of specific technologies can be used in a flat-panel display. Three currently common examples are liquid crystal display (LCD), light-emitting diode (LED), and organic light-emitting diode (OLED). Lighting technology such as OLED has allowed for bendable display screens, so the terminology of a flat-panel display does not exclude a screen with curvature.

The high picture quality, large available screen size, and portability of a flat panel display make it attractive for use in public areas. There are several special considerations relating to an FPD located where the public has access to it. Specifically, it would be desirable for the FPD to be protected against loss or vandalism. As with many public displays, it may be important for the content of the display to be reliability available. Consequently, the display should be readily accessed for servicing, as required. The needs for protection and accessibility for service can be conflicting.

It would be desirable to create a housing for an FPD that combines reasonable security with prompt access. The desired type of housing should provide a secure appearance, with tool-free operation so as to not invite tampering or other outside attempts to open the housing. At the same time, the tool-free operation should enable rapid, frequent, and reliable opening and closing, without substantial possibility of failure. Servicing technicians are thereby enabled to enter the housing quickly, perform necessary service, and reliably secure the housing in closed position.

It is particularly desirable that such a housing is operable without the need for conventional tools. As an example, screws often are featured fasteners on a housing, but retracting and refastening screws is time consuming, requires use of the appropriate tool, and is subject to failure due to lost screws, stripped screw holes, worn screw heads or tools, and the like. The viewable presence of common screw fasteners can be a further problem because it suggests a mode of entering the housing, which can encourage tampering. Accordingly, tool-free, empirically non-obvious fastening and mounting devices are an advantage both in terms of being non-encouraging to the outside viewer and efficient to personnel installing or servicing the FPD unit and other equipment within the housing.

To achieve the foregoing and other objects and in accordance with the purpose of the present invention, as embodied and broadly described herein, the method and apparatus of this invention may comprise the following.

BRIEF SUMMARY OF THE INVENTION

Against the described background, it is therefore a general object of the invention to provide a rapid access system formed of a protective display housing containing a flat panel display, with no necessary tool-driven mechanism for opening the display housing.

According to the invention, a display housing is transmutable between assembled and disassembled configurations. Front and back panels are arranged in alternative assembled or disassembled configurations. When in assembled configuration the panels form an interior chamber between them with a front panel defining a viewing window that visually accesses the interior chamber. An array of fasteners has open and closed positions and is operable between the front and back panels. When the fasteners are in closed position, they the front and back panels in assembled configuration. The array of fasteners is formed of receivers and hitches. The receivers are arranged in a pair of first and second receivers at a first spacing and are located on a first of the front and back panels. Each receiver has an entry side configured to engage a hitch, and the pair of receivers orients the entry sides in opposite directions chosen between outward facing direction placing each entry in an orientation facing away from the other entry of the pair and inward facing direction placing each entry in an orientation facing toward the other entry of the pair. The receivers each define a two-stage entry. The first stage entries of the receivers are located at respective first and second entry thresholds of the entry side of the respective receiver. Second stage entries of the receivers are located at respective first and second receiver seats located beyond the threshold of the respective receiver. The hitches are arranged in a pair of first and second hitches located on the second of the front and back panels at a second spacing locating the first and second hitches to align with respective entry sides of the first and second receivers. With respect to receivers oriented in the outward facing direction, the distance from the first seat to the second threshold is greater than the second spacing, such that when the first hitch is in the first seat and the second hitch is at the second threshold, the second threshold interferes with clear passage of the second hitch into the second seat but allows passage into the second seat by hand-applied pressure to place the panels in assembled position. With respect to receivers oriented in the inward facing direction, the distance from the first seat to the second threshold is less than the second spacing such that when the first hitch is in the first seat and the second hitch is at the second threshold, the second threshold interferes with clear passage of the second hitch into the second seat but allows passage into the second seat by hand-applied pressure to place the panels in assembled position.

According to another aspect of the invention, a rectangular housing is transmutable between a disassembled configuration for quick entry and an assembled configuration for quick closure. A front panel and a back panel arranged in alternative assembled or disassembled configurations, each panel having upper and lower ends and right and left sides, and when in the assembled configuration defining a closed housing with an interior chamber configured to contain a flat panel display, the front panel defining a viewing window visually accessing the interior chamber. When the front and back panels are aligned face-to-face, the back panel carries an upper finger disposed at the upper end of the housing and a lower finger disposed at the lower end of the housing. The upper finger is configured with a top edge disposed at an upward and forward angle, with a top seat located at the bottom of the upward angled top edge. The lower finger is configured with a bottom edge disposed at a downward and forward angle, with a bottom seat located at the top of the downward angled bottom edge and with a threshold at the forward end of the bottom edge. The top seat and the bottom seat are spaced at a first preselected distance. The front panel carries a transverse upper pin positioned to be received in the top seat and a lower pin positioned to be received in the bottom seat. The upper pin and lower pin are spaced at a second preselected distance. When the upper pin is engaged in the top seat, the upper pin is axially aligned with a transverse top pivot axis between right and left sides of the front and back panels. The top seat and the threshold are spaced at a third preselected distance, and the front panel is pivotable on the pivot axis to move the lower pin through an arc of travel positioning the lower pin at the threshold, which has a pressure-alterable restriction against advancement of the lower pin, located in the arc of travel of the lower pin. The restriction is responsive to hand pressure applied against the front panel to advance the lower pin into the second seat, placing the panels in assembled position.

In the assembled rapid access system, the back panel can be attached to a wall and equipped with a transverse hinge rod that will carry the flat panel display. A hanging bracket equipped with a hook can be attached to the rear of the flat panel display and hooked over the hinge rod, placing the display on the back panel.

The panels carry a system of fasteners distributed at the corners of the housing. The back panel has four forwardly extending fingers, one near each corner. The two upper fingers have an upward angle, and the two lower fingers have a downward angle. The front panel has four hitches positioned to engage the fingers to place the front panel in closed position. Closing is done by first, hooking the upper hitches over the upper fingers. Then, the front panel can be swung down to engage the lower hitches with the lower fingers. Vertical spacing of the upper and lower fingers and hitches establishes blocking points at the front ends of the lower fingers that interfere with passage of the lower hitches. The lower corners of the front panel can be firmly pressed to move the lower hitches past the blocking points and to hook the lower hitches under the lower fingers.

Opening the housing is equally rapid, first requiring that the lower end of the front panel be pulled free. This initial step pulls the lower hitches back over the blocking points and free of the lower fingers. The front panel can be equipped with finger-holes formed in a bottom wall to aid this initial pulling step. Second, the front panel is pivoted up as required and lifted free of the upper fingers. With the front panel removed, the housing is open and the flat panel display can be removed by unhooking it from the hinge rod. Thus, the rapid access system provides a housing with finished appearance that is rapidly and easily closed or opened.

According to a further aspect of the invention, two forming panels of a housing are secured together to provide secure enclosure, mounting, protection, and service access for a contained display. A scheme for securing together the two panels is formed by an array of receivers carried on a first one of the panels, and an array of matching hitches carried on the second panel in positions to engage with the receivers. The receivers are arranged in pairs with preselected separation and are directional, with two members of a receiver pair facing in opposite directions such as up and down. The hitches also are arranged in pairs with coordinated, preselected separation. A first hitch of a pair can be engaged in a first receiver of a pair, such as an upper receiver and upper hitch, resulting in the second or lower hitch having a defined residual path of travel into the second or lower receiver. The second receiver has a threshold in the defined residual path of the hitch, configured as a blocking surface sized and positioned to block entry of the second hitch member on the defined residual path. The threshold also is configured as a deflecting surface enabling deviation of the defined residual path sufficient for the second hitch to pass the threshold and enter the second receiver when the two panels are pushed together by sufficient pressure.

The housing can be opened by separating the two forming panels. First, the second hitch of a pair is withdrawn from the second receiver of a pair, initially following the defined residual path established by engagement of the first hitch in the first receiver to exit the second receiver. The blocking function of the threshold prevents the second hitch from withdrawing along the defined residual path. The threshold also serves as a deflecting surface responsive to sufficient pulling force applied between the two panels. The pulling force enables the second hitch to pass the blocking threshold and exit the second receiver. Subsequently, the first hitch member of the pair can be withdrawn from the first receiver member of the pair, thereby completing the separation of the two panels.

The first receiver of a pair of first and second receivers has a seat configured as an open hinge. The first hitch of a pair is configured as a pin sized to fit into the seat of the first receiver as a pivotal hinge pin. The hitch pair pivots on the hinge pin in the first receiver, with the second hitch thereby restrained to follow the defined residual path.

The accompanying drawings, which are incorporated in and form a part of the specification, illustrate preferred embodiments of the present invention, and together with the description, serve to explain the principles of the invention. In the drawings:

BRIEF DESCRIPTION OF THE SEVERAL VIEWS OF THE DRAWINGS

FIG. 5 is an isometric view taken from the front lower left of a front panel of the rapid access system, showing attachment pins and pulling edges thereof.

FIG. 6 is an isometric assembly view taken from the front left viewpoint of the rapid access system, with schematic hand positions and with assembly arrows suggesting final closure movement between said rear mounting panel of FIG. 1 said front panel of FIG. 2.

FIG. 7 is an isometric view similar to FIG. 6, showing schematic hand positions for engaging said pulling edges of FIG. 5, and with an arrow suggesting disassembly movement of said front panel.

FIG. 8A is a fragmentary pre-assembly side view of the display housing, with upper and lower seats facing outwardly and in opposite directions, with broken away center portion, and for clarity schematically showing a sidewall of the front panel as a connecting line following an axis between the attachment pins.

FIG. 8B is a fragmentary side view of the assembly of the display housing with upper fasteners engaged and pre-aligning the lower fasteners, with broken away center portion, and for clarity schematically showing a sidewall of the front panel as a connecting line following an axis between the attachment pins.

FIG. 8C is a fragmentary side view of the assembly of the display housing with upper fasteners and lower fasteners engaged, with broken away center portion, and for clarity schematically showing a sidewall of the front panel as a connecting line following an axis between attachment pins.

FIG. 8D is a fragmentary side view of the disassembly of the display housing with lower fasteners disengaged, with broken away center portion, and for clarity schematically showing a sidewall of the front panel as a connecting line following an axis between attachment pins.

FIG. 8E is a fragmentary side view of the disassembly of the display housing with upper and lower fasteners disengaged, with broken away center portion, and for clarity schematically showing a sidewall of the front panel as a connecting line following an axis between attachment pins.

FIG. 8F is a schematic layout with the upper and lower seats facing outwardly and in opposite directions, positioning the threshold to the lower seat, with an arc showing a defined residual path of travel of the lower pin to the lower seat when the upper pin is in the upper seat.

DETAILED DESCRIPTION OF THE INVENTION

Figure 1:
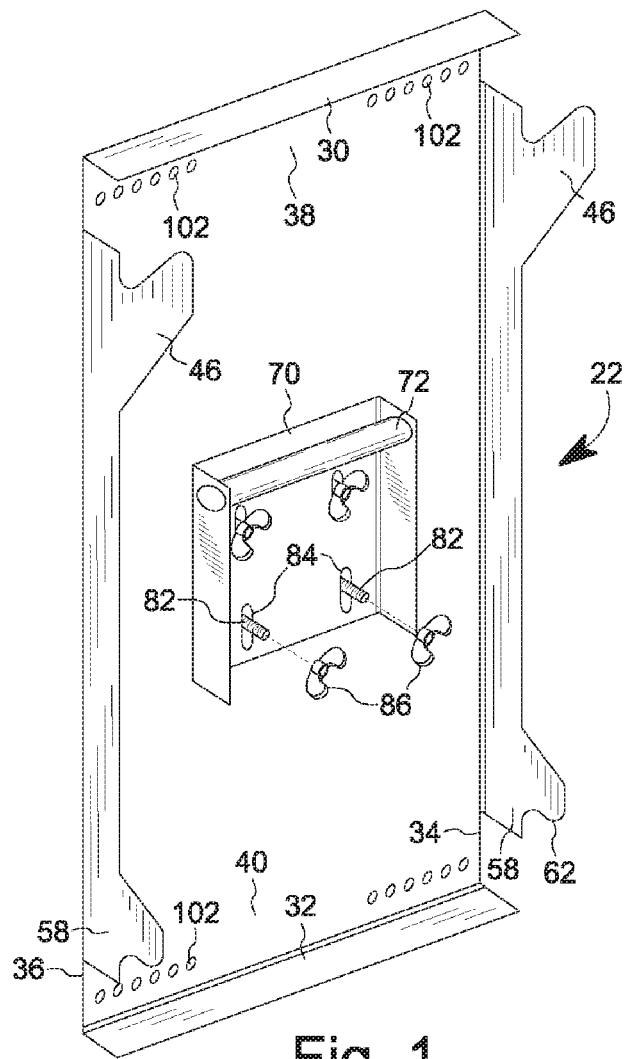
FIG. 1 is an isometric view taken from the front upper left of a rear mounting panel of the rapid access system, also showing a carrier on the front side thereof for attaching a video screen to the front face of the rear mounting panel.
Figure 2:
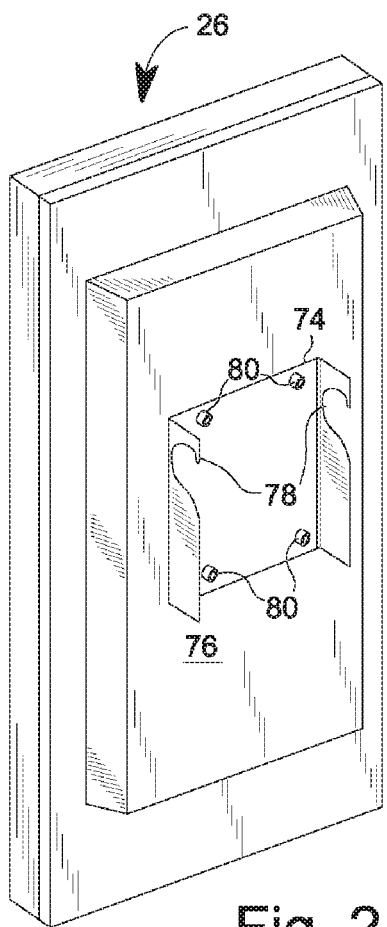
FIG. 2 is an isometric view taken from the rear upper left of a video screen with a mating hanger for engaging said carrier of FIG. 1.

With reference to the drawings, a display housing 20 is formed of a back panel 22 and a front window panel 24 that between them define an interior volume or chamber for containing a video display screen 26. The housing is configured to receive and contain the video display screen 26 in a stable position. The front panel 24 defines a viewing window 28 in its front wall, and the stable position of the video display screen 26 places the video image displayed thereon in a viewing position through the viewing window 28.

The display housing 20 is adapted to function in commercial or public areas. For this reason, the display housing 20 is configured with consideration for protecting the video display 26. Further, such a commercial display units may require ready, unhindered access by technicians for a variety of reasons that may include but are not limited to mechanical service, electronic service, modification of display content, and cleaning. A novel display housing 20 can meet and satisfy the combined needs of protection and ready access by employing an unconventional securing system with operating features that are not readily comprehended by mere viewing from outside the housing 20. Hence, the display housing 20 is an element of a rapid access system that provides a level of locked protection while displaying a clean exterior, which means that the exterior of the display housing 20 does not necessarily display obvious keyed locks or fasteners such as screws. The combined needs also are met by providing a rapid access system employing a tool-free opening technology, which enables access without requiring locks with separate entry keys. Entry can be provided primarily by manipulating the panels in accordance with pre-existing knowledge of the rapid access system and how the display housing functions, which can be shared among service technicians more readily than a special tool or a mechanical key.

The housing 20 can be rectangular or another shape and is transmutable between a disassembled configuration for entry and an assembled configuration for closure. Initially considering the housing as configured in disassembled configuration, a first aspect of the invention is a method and apparatus for combining a back panel 22 and a front panel 24 of a display housing 20, initially arranged in face-to-face positions, to form a secure assembled unit. It is desirable for the two panels to be held at a predefined spacing or interior volume of suitable thickness to accommodate the presence of a video display unit 26 between them. By suitably configuring the two panels, it is possible to arrange the front panel 24 either parallel to the back panel 22 or at another angle, as needed to accommodate the thickness and contours of the video display screen. The two panels are joined and locked together by a pair of fasteners that serve as receivers for two complementary hitches that are joined together on a common axis at a fixed separation. The fasteners are directional and may be configured as fingers that extend forward from the back panel with a top finger angled upwardly and a bottom finger angled downwardly. The fingers are located at left and right sidewalls 44, 45. Each forms a seat at the base of the angled finger, the top finger forming a seat on the upper side and the bottom finger forming a seat on the opposite, bottom side. The resulting seats are oppositely facing seats that form a lock when both hitches on the common axis are held in the opposite seats. The hitches may be configured as pins 56, 68 disposed crosswise to the right and left sidewalls 34, 36 of the front panel. The receivers operate along the common axis between the pins and the oppositely facing seats. The pins serve as restraints at each end of the common axis. The seats impose restraint from opposite directions. Thus, the receivers are directional because they engage the pins from two opposite directions.

A directional receiver of this type can be operated by overcoming resistive forces, which enable the receivers to be operated without tools. The receivers can be operated with means for placing one panel in tension and placing the other panel is compression, requiring a threshold force barrier to be overcome in order to create the tension and compression relationship to hold the panels together or to overcome the tension and compression relationship in order to separate the panels. The system of tension opposed by compression is applied between selected portions of the panels, located between opposed ends of the panels. For example, considering a rectangular display housing 20 hung squarely in vertical position, the selected, opposed ends might be at either the top end wall 30 versus bottom end wall 32 or the right sidewall 34 versus left sidewall 36. The means placing the respective panels in compression or tension may be located over a limited portion of the distance between opposed end walls, such as below a top setback 38 and above a bottom setback 40 from the respective top and bottom end walls of the panels. Such a setback provides room near the top and bottom ends for pertinent functional structures to be configured for suitable strength and performance. Additionally, the functional joining and locking structures are preferred to be located in a rectangular array within the display housing 20, where they are hidden, non-vulnerable and non-detectable in the assembled housing, thereby protecting the display housing from effective prying and break-ins. The size of the setback can be determined by the needed space to contain the functional structures, such as one or two inches from each endmost portion of the panel; or the setback can be selected as a proportion or percentage of the dimension between the opposed ends, such as a setback of five to ten percent of the dimension between endmost portions.

If desired, a first panel can be placed in a condition of either tension or compression and carries a pair of oppositely angled fingers such as directional receivers 46, 58, FIG. 1, located in upper and lower positions and aimed in substantially opposite directions. If desired, the second panel 24, FIGS. 5-7, can be placed in an opposite condition of compression or tension as compared to the first panel and carries a pair of hitches 56, 68 in respective upper and lower positions and that are aligned to engage the similarly located receivers. One or both types of fastener are configured to progressively engage with the other. The receivers and hitches are arranged to begin engagement at a preselected closeness of the back and front panels. This pre-contact closeness may be coordinated with the thickness and contour of the video display screen to be housed in the assembled display housing by placing the two panels against a video display screen positioned between them. The receivers 46, 58 are separated from one another by a first preselected spacing to establish desirable separation between junction points for the two panels. Similarly, the hitches 56, 68 are separated from one another by a second preselected spacing for separation of junction points and to coordinate and align with the respective positions of the receivers. Where used, the progressive engagement between the receivers and hitches is a product of tension and/or compression between the engaging fasteners. This relationship of tension and compression can drive the engaging fasteners toward progressively further engagement, such as travel of hitches down the angles of the receiving fingers, toward the base where the fingers are attached to the panel. Such further travel corresponds to increased closeness or snugness between the first and second panels. The engaging fasteners may have an ultimate stop at a point that concludes further progressive engagement, such as at the base where the fingers are attached to the panel. It would be desirable for this ultimate stop to establish suitable closeness between the two panels to secure the contained video display screen. The engaging fastener portions also may cease further progressive engagement if the panels abut or strike an interfering object before reaching an ultimate stop. Such an interfering object might be the video display screen held between the panels. Thus, the size of the chamber within the display housing is coordinated with the size of the video display screen to ensure that the video display screen is not too thick for the fasteners to become engaged. The first receiver and first hitch may be located and operated during the engagement process to align the two panels both by height and by face-to-face closeness.

FIGS. 8A-8C are a series of views illustrating an engagement between the first and second panels. The first, back panel 22 is represented as a left sidewall 44 of back panel 22. The second, front panel 24 has left sidewall 36 schematically illustrated in FIGS. 8A-8C as line 54, also representing a preselected distance on an axis between the two pins 56, 68. The back and front panels could be reversed in choice of carried fastener portions. According to one possible example of an arrangement of fasteners, the directional first receiver 46 has optional two-stage entry. The optional aspect of the entry is whether the upwardly angling finger 46 will engage hitch 56 at a first stage entry point 50, as such first state engagement is optional at the top fasteners. The hitch 56 can be further received at stage two, further within the receiver and drawing together the front and back panels. Hitch 56 can reach an upper seat 46 having a face or edge open to the top. The second receiver 58 is shown as a downwardly angling finger that forms a lower seat 60 with an open face toward the bottom of sidewall 44. Two-stage entry is by hitch 68 first engaging entry point 62 and then reaching the deeper location of lower seat 60. The reference to top or bottom positions is merely for convenience of description and is not a limitation, as the panels and assembled display housing, itself, can be disposed at any desired angle or tilt, such as side-to-side, front-to-back, or even upside down. The two first receivers 46, 58 may be distinguished by one being called a top receiver 46, which may correspond to the top or upper fastener portion but chiefly is the receiver that during assembly of the housing is first engaged with an upper hitch from the other panel. The second receiver 58, while called a bottom receiver, is the receiver that during assembly of the housing is second to be engaged and completes the assembly.

Figure 8G:
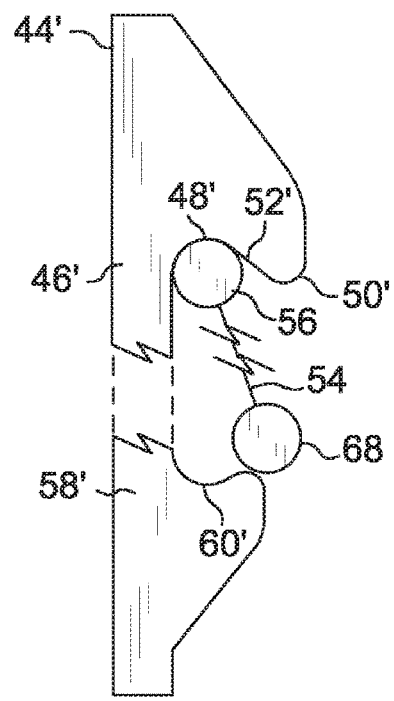
FIG. 8G is a fragmentary side view of the assembly of the display housing with upper fasteners engaged and pre-aligning the lower fasteners, with upper and lower seats facing centrally and in opposite directions with broken away center portion, and for clarity schematically showing a sidewall of the front panel as a connecting line following an axis between attachment pins.
Figure 8H:
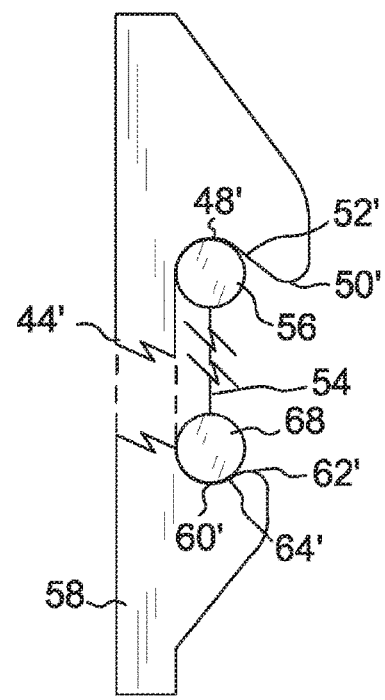
FIG. 8H is a fragmentary side view of the assembly of the display housing with upper fasteners and lower fasteners engaged, with upper and lower seats facing centrally and in opposite directions, with broken away center portion, and for clarity schematically showing a sidewall of the front panel as a connecting line following an axis between seated pins.

Further, the open face of the directional seat of the first receiver also can be modified by placing the open face of the seat in an opposite orientation, such as placing the open seats of a pair of receivers to face one another. FIGS. 8G-H disclose such opposed seats 48' and 60' facing toward one another. In the illustrated orientation of the seats in FIGS. 8A-C, lower seats 58 have a first stage entry threshold 62 and optionally, an incline or sloped surface 64 leading from the threshold 62 to the second stage seat 60. The inclined surface, where used, is positioned so that the lower hitch 68, when in tension on threshold 62, will be urged to progressively enter from the first stage entry at the threshold to the deeper engagement with the seat 60, nearer to the back panel 22. In an alternative orientation of the seat openings, such as the illustrated orientation of FIG. 8G-H, the seats 48', 60' face toward one another. The first receiver may be the larger receiver 46', and the second receiver may be the smaller receiver 58'. The hitch 68 can be neutral or in compression instead of in tension and, due to the compression, will progressively enter the receiver 58' from threshold 62' to seat 60' from a central position. Thus, these variations are within the scope of the invention.

In the example illustrated in FIGS. 8A-8C, the left side receivers 46, 58 are on a vertical left sidewall 44 of the back panel, with the position of the back panel depending into the back of the drawing. This back panel sidewall 44 can be neutral in tension or compression in FIG. 8A but will become a compression element in FIGS. 8B and 8C. An upper receiver 46 operates as a hinge with an open top suited to receive a hitch embodied as a top transverse hinge pin 56 that is aligned with a transverse top pivot axis between right and left sides of the front and back panels. The top pin 56 is placed by hand, optionally at stage one entry point 50 or deeper into the receiver at seat 48, nearer to back panel 22. Pin 56 can follow arrow 55 to deeper, stage two engagement with seat 48, then allowing the front panel to pivot on the pin 56. A threshold force barrier with leading end 50 extends to the top right of the receiver and defines a hinge pin seat 48 between the panel sidewall 44 and entry threshold 50 at the top entry point of the seat 48. An optional incline or smooth edge 52 depends from threshold 50 to seat 48. The incline serves to help direct the hinge pin into the seat and also aids in smooth removal of the hinge pin from the seat. A left sidewall of the front panel is schematically shown as the connecting line 54, which tracks an axis between the upper and lower pins and is a tension element according to FIGS. 8B and 8C. The sidewall 54 carries an upper hitch configured as an upper hinge pin 56 in an orientation suitable to be hung in seat 48. Initially, the hinge pin 56 can be hung in seat 48 by hand placement of the front panel wall 54, following the suggested movement arrow 55 at pin 56 of FIG. 8A.

FIG. 6 shows a similar arrangement of parts with initial engagement between top receiver 46 and hitch 56, followed by swinging down the front panel to engage the bottom receiver 58 with hitch 68, the latter motion suggested by movement arrows 69 at the bottom of FIG. 6. The representation in FIG. 6 shows human hands 96 applied to the front panel to show that achieving alignment between the panels to apply the front panel to the back panel is suited as a hand operation. The incline 52 and threshold 50 in FIG. 8A are retaining elements, sufficient to maintain the pin 56 in top seat 48 when the pin 56 and sidewall 54 are in tension against seat 48.

In FIG. 8A, an oppositely disposed second or lower receiver 58 at the bottom of sidewall 44 is configured as a downwardly angled finger. The second receiver has a nose configured to function as a clip or hook suited to engage with a lower hitch 68 of the front panel. In this FIG. 8A, the lower receiver 58 extends to the bottom right of sidewall 44 and defines a lower seat 60 that is open toward the bottom, or more generally, open in a direction opposite from top seat 48. The open bottom is positioned between the panel sidewall 44 and a downwardly extended entry threshold 62. The bottom incline or smooth edge 64 depends from a bottom of seat 60 to a lower threshold point 62. Thus, in the example of a vertically hung display housing, the lower hitch is a pin 68 that operates in controlling tension to overcome and pass under the lower threshold 62 and travel up the sloped surface 64 to enter seat 60.

According to the view of FIG. 8B, the top hinge pin 56 has been hung on hinge seat 48, combining the first receiver with the first hitch. The left sidewall of the front panel 54 also carries a lower hitch 68 at a preselected distance from upper hitch 56 to enter seat 60. However, the front panel sidewall 54 carries the upper and lower pins 56, 68 at too close a mutual spacing for pin 68 to freely overcome the threshold force barrier at point 62 when top hinge pin 56 is in seat 48. The movement arrow 71 at lower hitch 68 in FIG. 8B suggests that threshold force barrier 62 interferes with unhindered movement of lower hitch 68 into lower seat 60. The top seat 48 and the lower threshold point 62 are at a preselected distance that is greater than the preselected distance 54 between pins 56 and 68. Due to this difference in separations, threshold point 62 is a pressure-alterable restriction against advancement of the lower pin 68 into seat 60. Where portion 62 of the threshold wall restricts passage of the hitch 68 into the seat 60 past the threshold, hand pressure can be applied to the area of the lower fastener to deflect interfering components as necessary to move hitch 68 or threshold 62 past one another. The deflection across threshold 62 and movement into seat 60 are accomplished by applying threshold force against the front panel 24, pushing the lower hitch 68 across threshold 62. Overcoming the physical interference of threshold 62 places front sidewall 54, hitch 56, and hitch 68 in tension, which completes assembly of the housing 20 by pushing hitch 68 into seat 60 while retaining hitch 56 in seat 48. The assembled upper and lower fasteners establish a lock that secures together the front cover 24 and back cover 22.

In FIG. 8C the lower hitch 68 has been forced over the restriction of threshold 62 and has entered seat 60. Seats 48 and 60 are at sufficient separation that the hitches 56, 68 are held either neutrally or in tension across sidewall 54. Where tension is present, the tension maintains the two hitches in seats 48 and 60. Either hitch can be removed from its seat by application of sufficient reverse force over an inclined edge 52 or 64 and over a threshold point 50, 62. The reverse force must be sufficient to overcome the tension preventing the respective hitch from exiting over the threshold of its seat. The top receiver 46 is shown to be larger than the bottom receiver 58, with a larger displacement at threshold 50. Thus, the preferred location to originate unfastening is at the smaller bottom receiver 58, where the threshold displacement is less and thereby requires less force to pull the hitch 68 over the restriction of the threshold. In FIG. 8C, the illustrated positions of the hitches 56, 68 are fully in the respective seats, which serve as ultimate stops and limit the closeness of the first and second panels. It is possible that the hitches will be stopped before reaching the seats if some other stop precedes the seats, such as if a video display screen contained in the display housing 20 is of a thickness that limits the approach of the two panels. In that case, the hitches 56, 68 might remain on the inclines 52, 64 with spacing between first and second panels being as established by the size and contour of the video display screen.

In FIGS. 8A-8C, a pair of receivers 46, 58 are located in upper and lower positions on a sidewall 44 of the first panel. The right side of these views shows a pair of pins 56, 68 in upper and lower positions, coordinated with the pair of pair of receivers 46, 58. An upper pin 56 and a lower pin 68 are connected to a sidewall of the second panel 24, where they are positioned to interact with the receivers 46, 58. In the drawings, a schematic line 54 represents the sidewall of the second panel carrying both pins. The schematic rendering 54 is used to maintain clarity of the series of views in FIGS. 8A-C.

FIG. 8A is a pre-assembly view where top pin 56 is being hooked into the top seat 48 of the top receiver 46, while the front panel sidewall 54 is holding bottom hitch 68 at a spaced position from bottom receiver 58. The pre-assembly is a first step that can be accomplished by hand and does not require such a high force as will be required subsequently to force lower hitch 68 into lower seat 60. During pre-assembly, the bottom of the front panel may be pivoted up as required while engaging the upper hitch 56 in the upper receiver 46, forming a hinge on a transverse axis, after which the front panel is pivoted down at the axis.

In the view of FIG. 8B, the top pin 56 is resting in seat 48 and thereby is aligning the second panel 54 at a specified height with respect to the first panel. Also in accordance with view 8B, the lower hitch 68 has been positioned against an entry threshold point 62 at the entry to lower receiver 58. The position of the hitches 68 is coordinated with the positions of the receivers 46, 58 to place lower hitch 68 at the restriction point 62 when upper pin 56 is in upper seat 48. The restriction point 62 is one example of a pressure-alterable restriction in the predefined arc 65 (FIG. 8F) that blocks the path of hitch 68 moving in the path of the arc into seat 60 of the bottom receiver 58. Application of a preselected pressure is necessary to push lower hitch 68 past entry restriction 62. A hand-applied force can be suitable. Finally, FIG. 8C shows hitch 68 after being pushed into seat 60 by the preselected threshold force. With the hitches 56, 68 in seats 48, 60, the second panel 54 might be neutral or in tension between hitches 56, 68, depending upon the neutral separation between the two pins. The first panel is neutral or in compression between the receivers 46, 58.

FIG. 8F, not to scale, shows an example of a spacing layout of top seat 48, lower seat 60, and lower threshold 62. A preselected distance from top seat 48 to bottom seat 60 is represented by the distance line 57, which also can be equal to a preselected distance between hitches of a pair, represented by line 54, FIGS. 8A-8E, between the hitches 56, 68. Arc 65 is established using line 57 as a radius from a pivot point of the upper hitch in seat 48. Arc 65 represents a defined residual path of available travel of the lower hitch when the upper hitch is in seat 48. In the views of FIGS. 8A through 8C, threshold point 62 is positioned to restrict passage of hitch 68 moving past the threshold on arc 65. To provide desired restriction through threshold 62, a wall of the threshold including a restriction point 62 is located at a longer radius line 67, which is the radius 57 plus a selected further distance represented by a positive dimension of gap 66. The dimension of gap 66 beyond the radius of arc 65 can be chosen as a product of various considerations, including panel sizes, material strengths and desired threshold force at point 62. The gap 66 can be sized as desired to correspondingly restrict passage of the pin 68 into or out of the seat 60. As an example, a suitable dimension for gap 66 often is 0.025 inches. Further, the described radius and use of arc 65 is suited for locating seat 60 to capture pin 68 with neutral tension or compression. The length of line 57 can be selected to be shorter than line 54 to create residual tension between pins 56, 68.

FIGS. 8G and 8H have similarities to FIGS. 8B and 8C but differ in at least the following ways. The sidewall 44' carries receivers 46' and 58' that have open faces facing each other, while receivers 46 and 58 have open faces directed away from each other. The upper hitch or pin 56 is placed in seat 48' by lifting the upper hitch into the seat 48', while upper hitch 56 in FIGS. 8A-B is placed in seat 48 by lowering the upper hitch into the seat 48. Threshold 50' and sloped edge 52' serve as retainers holding fastener 56 in seat 48'. Then the lower hitch 68 is pushed against lower threshold restriction 62' to cause sufficient displacement for the hitch 68 to pass over the threshold and enter lower seat 60'. Due to the reversed orientations of the receivers 46', 58', available compression and tension, if used, are reversed as compared to FIGS. 8B-C. Correspondingly, in FIGS. 8G-H back panel sidewall 44' can be placed in tension, while front panel sidewall 54 can be placed in compression.

Figure 8J:
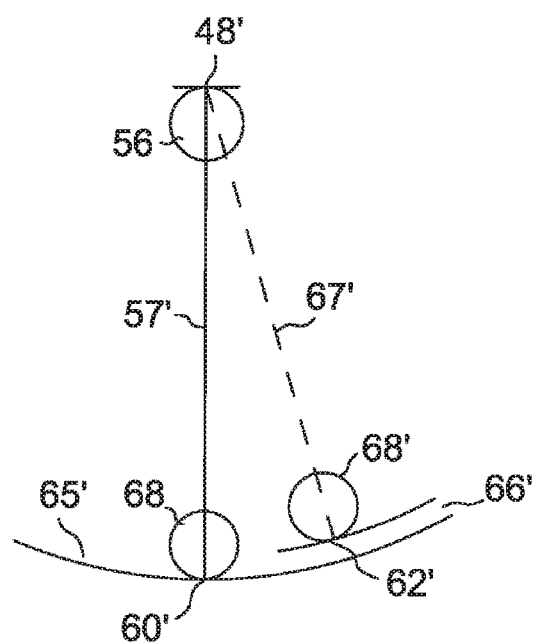
FIG. 8J is a schematic layout for positioning upper and lower seats, with upper and lower seats facing centrally and in opposite directions, and positioning the threshold to the lower seat with an arc showing a defined residual path of travel of the lower pin to the lower seat when the upper pin is in the upper seat.
Figure 9:
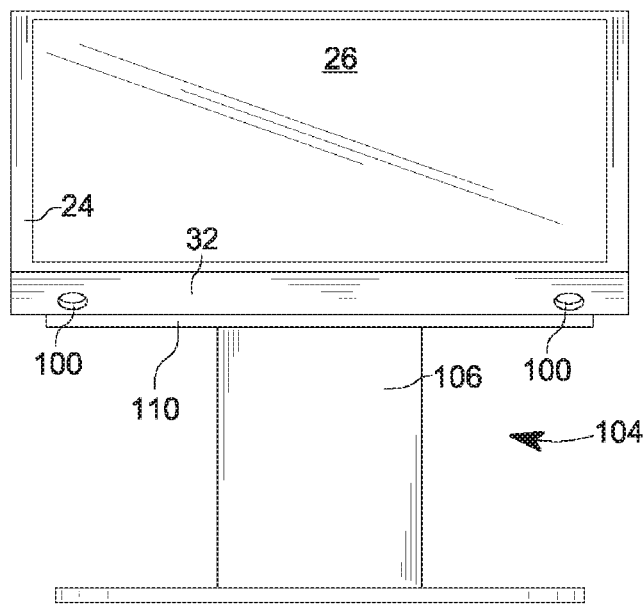
FIG. 9 is a front elevation view of the rapid access system adapted to a kiosk.
Figure 10:
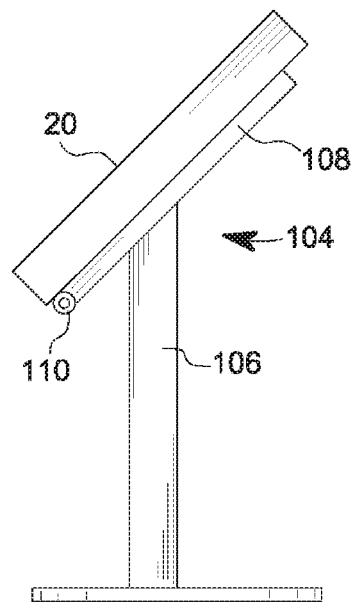
FIG. 10 is a right side elevation view of the rapid access system adapted to a kiosk.
Figure 11:
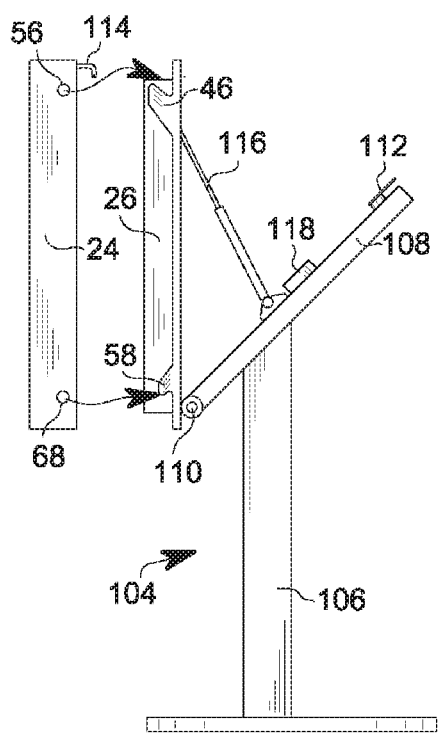
FIG. 11 is a right side elevation view similar to FIG. 9, showing the rapid access system in open position on a kiosk, and showing assembly arrows between said front panel and said rear panel.
Figure 12:
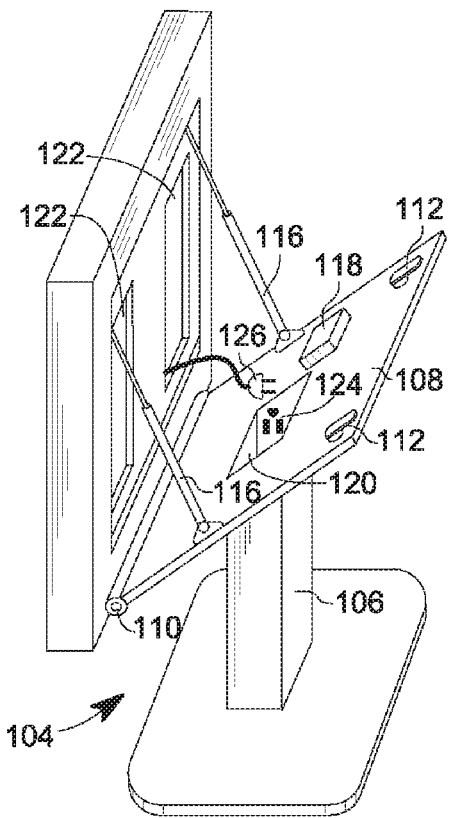
FIG. 12 is an isometric view taken from an upper right rear viewpoint, showing the rapid access system in open position on a kiosk, and showing inner components thereof.

FIG. 8J, not to scale, shows a spacing layout applicable to the central facing seats 48', 60' and lower threshold 62' of FIGS. 8G and 8H. Due to the central facing orientation of the seats 48', 60', the distance 57' between seats 48' and 60' includes the diameters of pins 56, 68. The arc 65' is a line of neutral force between pins 56, 68 when in seats 48', 60', generated using distance 57' from point 48' as radius of arc 65'. For planning a position of an effective lower restriction point 62', a negative gap 66' is located above arc 65' by a chosen gap distance and is subtracted from radius 57' to determine threshold point 62'. Thus, the radius line 67' from seat 48' to threshold restriction point 62' is shortened by gap 66' as shown by pin 68', positioned above arc 65' by the dimension of gap 66'.

In the preferred embodiment of the invention, a wall of the threshold 62, 62' can serve as an alterable restriction in the predefined arc 65, 65'. Alternative restrictions might employ mechanical springs or ball detents.

In keeping with described variations, the back panel 22 may be chosen to be in compression; and the front panel 24 may be chosen to be in tension. The pair of receivers 46, 58 associated with the back panel 22 or sidewall 44 may be regarded as static, showing neither substantial movement nor deflection during attachment to the pair of hitches 56, 68. The hitches 56, 68 may be regarded as dynamic, having a capacity to bend or deflect either in combination with some portion of their attached panel sidewalls 34, 36 or alone, deflecting with respect to the attached panel sidewalls. As described herein, the back panel 22 is a better choice to be placed in compression and to carry the static receivers 46, 58. The front panel 24 is the better choice to be placed in tension and to carry the dynamic hitches 56, 68. It would be possible to reverse the panel positions or reverse the choices of which fasteners are carried on which panel.

The hinge seat 48 is configured to receive hinge pin 56 and together with incline 52 and threshold 50, retain pin 56 in seat 48, thereby drawing together the two panels 22, 24 at a height established by hinge pin 56 in hinge seat 48. If the display housing 20 is vertically mounted, the force of gravity might be sufficient to place and retain hinge pin 56 in seat 48, but if greater force is needed, a human operator represented by hands 96, FIG. 6, can force hinge pin 56 into seat 48. A higher applied force is available to join the two fastening elements 48, 56 by subsequently engaging the lower receiver and hitch 58, 68. The lower pin 68 may be forced into seat 60 by tension sliding the pin on edge 64; or pin 68 can enter seat 60 by applied hand pressure pushing the pin toward the seat. Regardless of whether the pins 68 enter the seats 60 by tension driven sliding or by applied pressure, the pins 56, 68 and wall 54 are in tension during entry by pin 68.

Optionally, the spacings as described in FIGS. 8F and 8J can be used to maintain the pins in tension even after full entry into seats 60, 60'. The tension relationship can be used to continue to apply a closing force between the two panels 22, 24 and to maintain them in locked position. By forcing the pins 68 against the entry threshold 62, the pins 68 are deflected past the entry point 62 under entry pressure exceeding the threshold force. Thereafter the pins 68 achieve a stable position in bottom seats 60. Movement of pins 68 into seats 60 primarily is a function of force generated by the tension between pins 56 and 68, regardless of the position of the inclined surface 64 with respect to gravity. The movement is accompanied by a drawing together of the panels 22, 24 with increased overlap of sidewalls 44, 54. A maximum closeness of the two panels 22, 24 will be reached when the panels or an associated component thereof abut. The abutting components may be pins 56, 68 and the positions of seats 48, 60, in which case the pins cannot progress further along the inclines 52, 64. The separation of the upper and lower members of the respective pairs of receivers and hitches of the two panels 22, 24, can be such that tension will be present between pins 56, 68 to establish a securely locked condition. The described method using receivers 58 in fixed positions on the sidewalls may be called the fixed receiver method.

Figure 13:
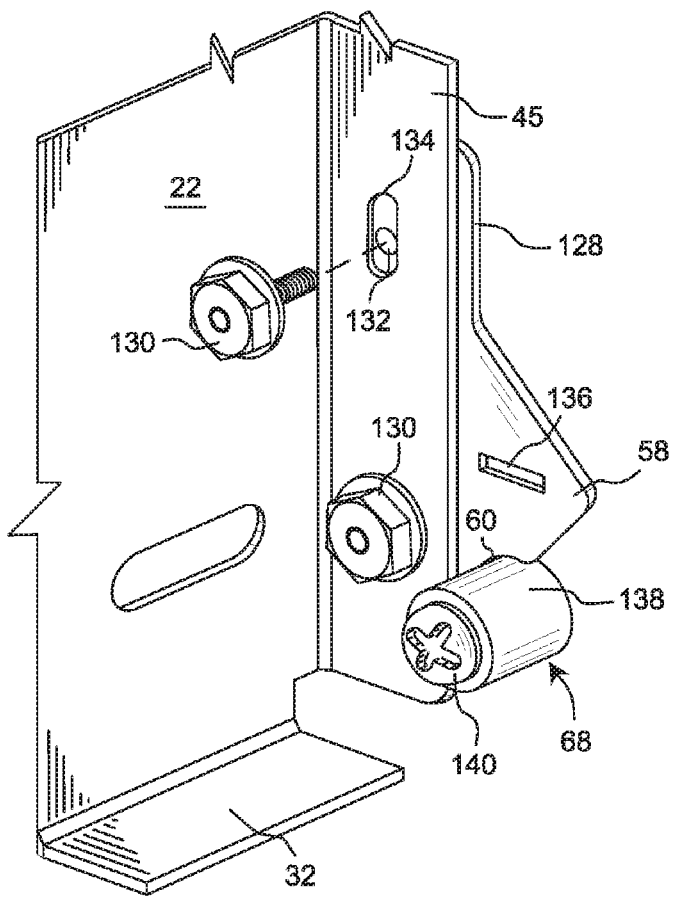
FIG. 13 is an isometric, fragmentary view of a back panel right sidewall at the lower right hand corner thereof, showing a modified sidewall with the lower receiver on a sliding plate, and showing a modified lower pin carrying a rotary sleeve that engages the lower receiver.
Figure 14:
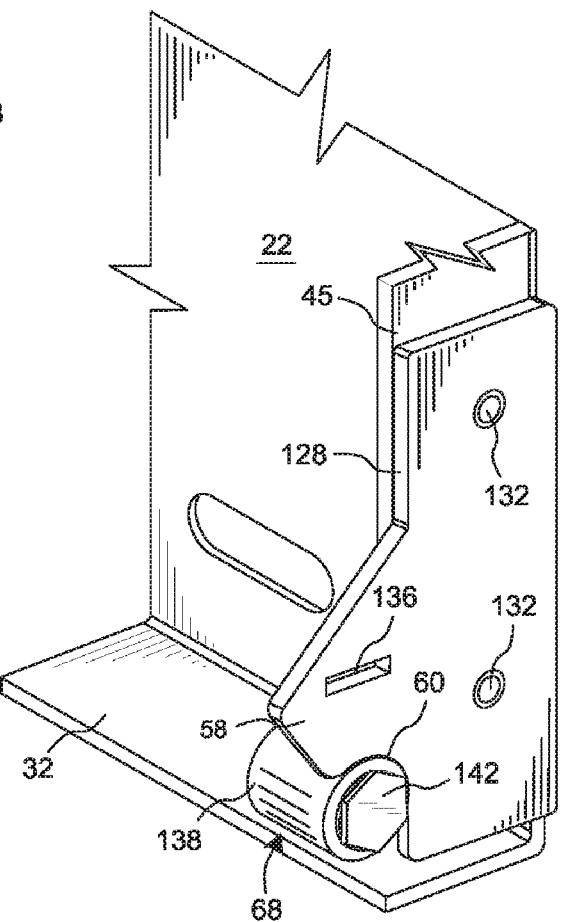
FIG. 14 is an isometric, fragmentary view of a back panel right sidewall at the lower right hand corner thereof, showing a modified sidewall with the lower receiver on a sliding plate, and showing a modified lower pin carrying a rotary sleeve that engages the lower receiver.

FIGS. 13 and 14 show a fixed slide method for carrying receivers 58. The modification is preferred to be applied to the lower receivers 58 and as an example is illustrated in the drawings to be applied to a right sidewall 45. In use, the modification would be applied to both sidewalls 44, 45. The receiver 58 is arranged as a component of a slide plate 128 that is guided to move parallel to a sidewall 45. At least a pair of compression fasteners such as bolts 130 secures the slide plate 128 at a variable, preselected position along the right or left sidewall. The bolts secure the slide plate between the head of bolt 130 on the inside of the sidewall and a threaded hole 132 in the slide plate receiving the threaded shaft of the bolt, together pinching the slide plate against the outside of the sidewall. Sidewall 45 forms passages 134 shaped as elongated keyways oriented on an axis between upper and lower receivers to allow the bolts to move in the keyways to reposition the slide plate at a varied separation from the top receiver on sidewall 45. As an example, the keyway 134 may allow the bolt position to vary by 0.25 inch, which is suitable for many applications where a front or back panel is flexible enough to otherwise engage the other panel too loosely. A leverage slot 136 in the receiver on the slide plate provides ready engagement by a screwdriver or similar tool to hold the slide plate at the needed separation from the upper receiver while bolts 130 are secured.

FIGS. 13 and 14 also illustrate an isolated pin 68 of the type described as being carried on the front panel 24, engaged in a receiver pocket 60. In FIG. 13, the pin 68 is shown as having a sleeve 138 carried on the core of the pin, which may be the shaft of an axial fastener. The sleeve is secured by removable end fasteners suggested by screw head 140 at the left end of the sleeve in FIG. 13 and a mating hex headed fastener 142 at the right end of the sleeve. The sleeve can be replaced when worn by removing and replacing the fasteners, without requiring the more difficult task of removing a welded pin on the front panel.

Figure 15:
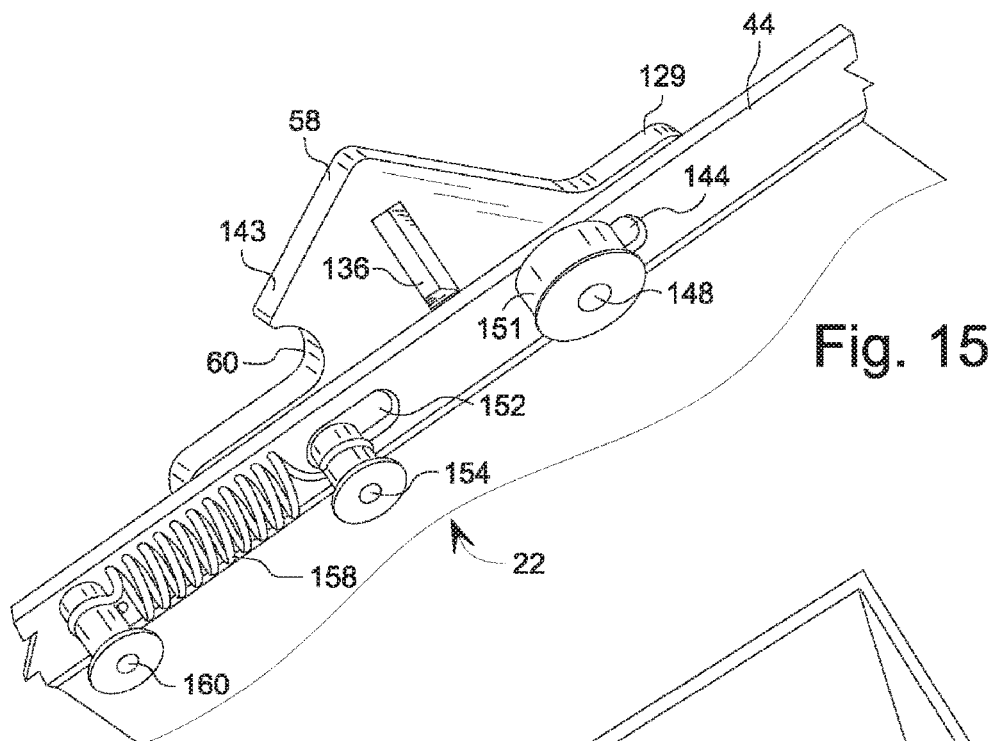
FIG. 15 is an isometric, fragmentary view of a back panel left sidewall at the lower left hand corner thereof, showing a modified sidewall and receiver on a spring loaded sliding plate.
Figure 16:
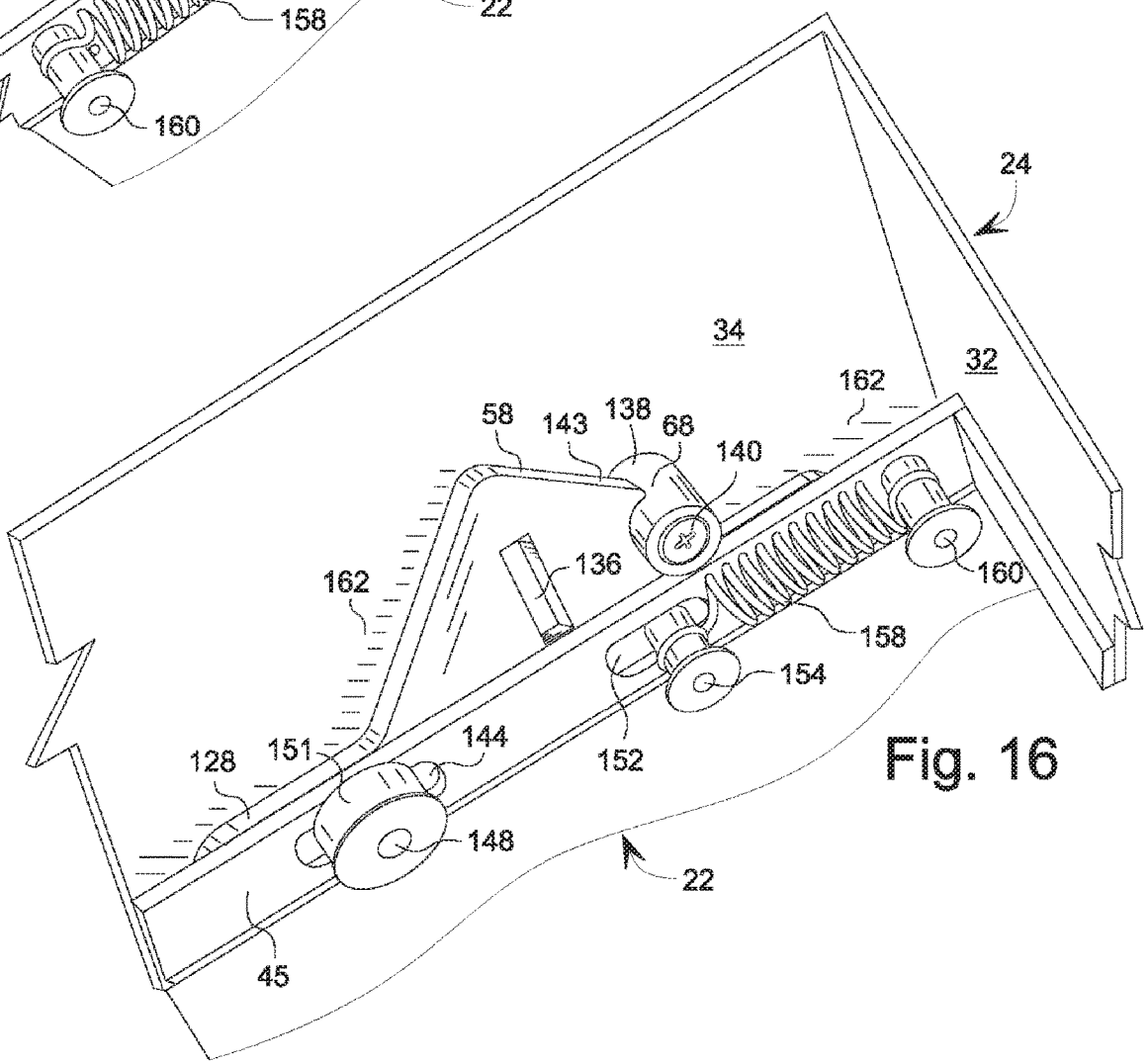
FIG. 16 is an isometric, fragmentary view of a back panel right sidewall at the lower right hand corner thereof, showing a modified sidewall and receiver on a spring loaded sliding plate.
Figure 17:
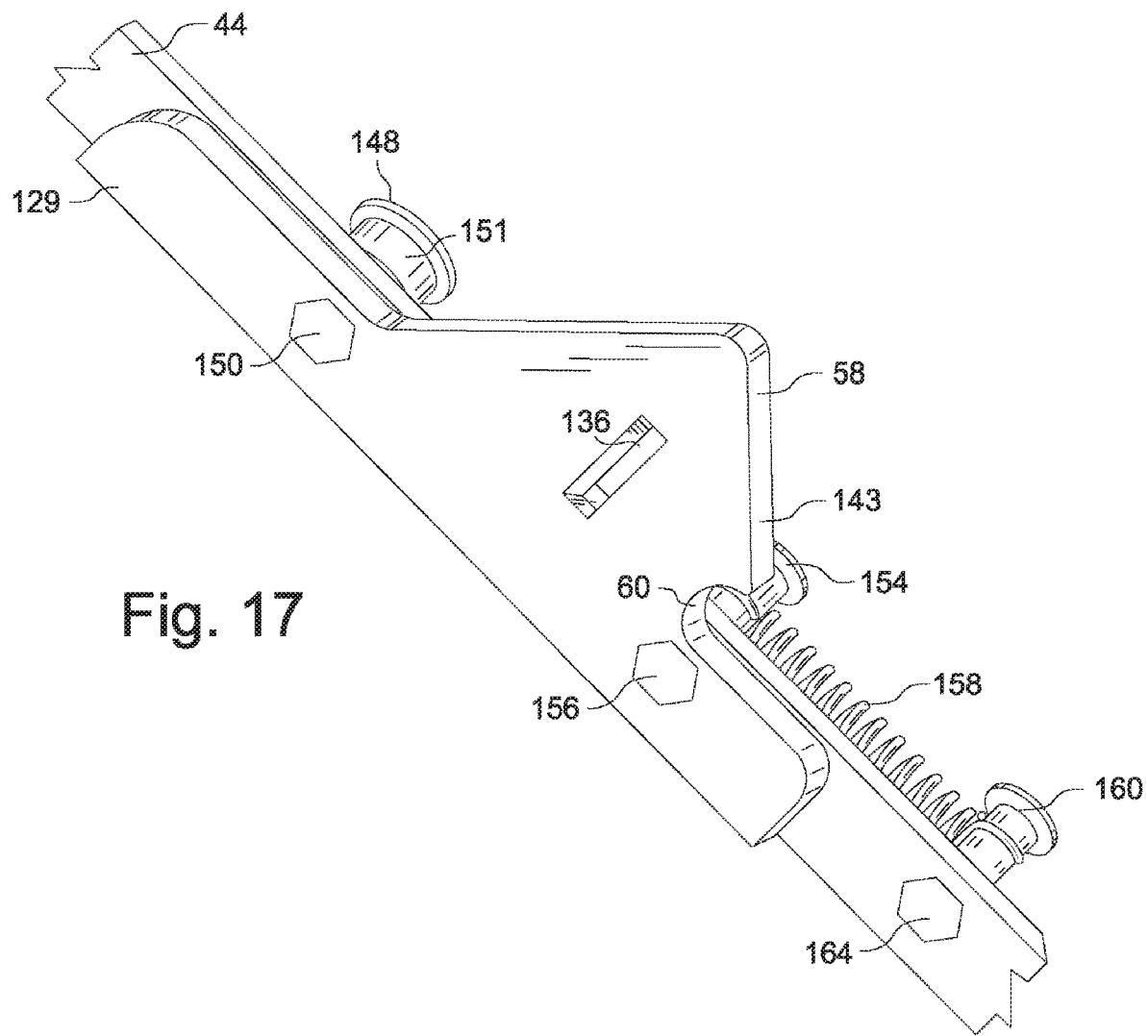
FIG. 17 is an isometric, fragmentary view of a receiver on a spring loaded sliding plate at the lower left hand corner or a back panel.

FIGS. 15-17 illustrate a spring-loaded slide method for carrying receivers 58. According to this method, receivers are applied to slide along a sidewall, either with or against a spring force. At one point, the seat 60 of a receiver is closed to receive a pin 68. This point is shown at FIGS. 15 and 17. At a second point, the seat of a receiver is open to receive a pin 68, as best shown in the sequence of FIGS. 8A-8C. At completion point, pin 68 is inside seat 60 and the receiver is able to move slightly forward for the seat 60 to meet the matching contour of the pin 68, best shown in FIG. 16. The front panel 24 is pre-positioned to apply pin 68 against the angled edge 143 of the receiver as the housing 20 is closed. The edge 143 is pushed back against spring force, spring-loading the seat 60 to a longitudinal ready position for receiving the engageable pin 68 to complete a closing and latching sequence. A spring or other resilient member biases the receiver 58 in a forward direction, where the term "forward" refers to the longitudinal end of the receiver with an open face of a seat 60. After being pushed back at edge 143, the seat 60 moves forward to a point where it receives a pin or latch from the front panel of the housing. The forward direction is toward the left in FIG. 15 and toward the right in FIGS. 16 and 17. The spring biases the receiver in a forward direction, toward a pin 68 that has entered the seat 60 to assist entry of the pin into the seat. The receiver is moveable in the opposite or rearward direction against the force of the spring to move the open face of the seat 60 rearward to aid in removal of the pin.

Spring-loading the receivers provides two solutions to potential locking problems. First, as housings 20 are produced to receive video screens in different sizes, it might be difficult to exactly design the fixed spacing and contour of the fixed receiver method, illustrated in FIGS. 1 and 3. Even assembling and disassembling a fixed slide might be difficult, if initial settings prove to be too loose or too tight. Instead, the spring-loaded slide offers an acceptable range of slide positions, over a range of spring positions. The spring provides automatic adjustment or self-adjustment within a range of spring expansion or contraction.

In greater detail, FIGS. 15-17 show a spring-loaded slide applied to either right or left sidewall 44, 45. FIGS. 15 and 17 show application to a left sidewall 44, and FIG. 16 shows application to a right sidewall 45. The applications to the opposite sidewalls are mirror images and are taken together to show the full spring-loaded slide method. In each, a slide is located on the outer face of the sidewall, with a left slide 129 on the outer face of left sidewall 44, best shown in FIGS. 15 and 17, and with a right slide 128 on the outside face of right sidewall 45, best shown in FIG. 16. Each slide carries a superstructure above the height of the adjacent sidewall, providing room for the pin 69 to push down against edge 143. The superstructure consists of a seat 60 in a receiver 58 with a downward sloped edge 143 above seat 60 and leading to the top of the front opening into seat 60. The sloped edge functions as an extended threshold 62, FIG. 8B. Downward sloping edge 143 also functions as the lower finger 58 disposed at said lower end of the housing as shown in FIG. 8A. The sloped edge 143 acts as a slide mover positioned to be applied against the first panel during transmutation of the housing from open to closed configuration. The applied portion of the first panel can be a pin 68 or another structure suited to push against edge 143. The length of edge 143 is extended as compared to a shorter length of threshold 62, spreading the pressure applied between pin 68 and receiver 58. A pin 68 pressing down on edge 143 from above the top of the sidewall 44, 45 forces the edge 143 and seat 60 rearward so that pin 68 is lowered to the front open face of seat 60.

The receiver 58 is positioned such that the open face of the seat 60 is in the opposite direction from the top seats 48. In FIGS. 15-17, the open face of seat 60 faces housing bottom 32. In the embodiment of FIGS. 8G-8H, the open face of seat 60' faces the housing top 30. The direction between the top and bottom ends of a sidewall is regarded as longitudinal. The positions of housing bottom 32 or housing top 30 also indicate top and bottom or upper and lower ends of a longitudinal extent. The left or right side placement of the slides 128, 129 is a function of the chosen mounting hardware and which longitudinal direction the seat 60 faces in mounted position on receiver 58 of each slide. If desired, a receiver 58 can be structured with a pair of longitudinally oppositely facing open seats 60 so that the receiver is reversible and can be used on either left or right side, with the slide is otherwise structured to be reversible, as well.

In order to implement longitudinal sliding action along a sidewall, a slide 128, 129 is arranged on the outside surface of the appropriate sidewall 44, 45 and is fastened through the sidewall at least at two locations. Each fastening location is at a longitudinally elongated keyway slot in the sidewall.

For example, in FIG. 15, a first longitudinal keyway slot 144 is located in sidewall 44 near the upper longitudinal end of the slide 129, placing slot 144 nearer to the longitudinal top of the sidewall. A first fastener is a screw or bolt 148 laterally placed through the first keyway slot 144 and engaged in the slide 129 at a holder that is a first cap nut 150, embedded in the slide and nonrotatable, as best shown at FIG. 17. The first screw or bolt 148, as best shown in FIGS. 15 and 16, carries a large diameter plastic glide sleeve 151 that smoothly slides on the sidewall 44, maintaining the slide 129 in slidable relationship against the sidewall 44 without requiring the first bolt 148 to be unduly loose or tight.

Further in the example, a second longitudinal keyway slot 152 in the sidewall 44 is longitudinally spaced below the first keyway slot, such as below the upper longitudinal end of the slide 129, nearer the midpoint of the slide. A second fastener is a screw or bolt 154, optionally a shoulder screw or bolt that fits through the second keyway slot 152 at least to the shoulder, where optionally present. Second fastener 154 engages the slide 129 at a second holder that is a second cap nut 156, nonrotatably embedded in the slide. Longitudinal positions of the two holders 150, 156 in the slide are coordinated with the positions of the two keyways 144, 152 to allow similar longitudinal, back-and-forth movement of the fasteners 148,154 in the lengths of the keyways, establishing a range of sliding movement for the receiver 58.

In the example, the second screw or bolt 154 is a sliding distance control element, and also is a first, top end anchor for longitudinal spring 158. A second, bottom end anchor for the spring 158 is a third fastener, a screw or bolt 160, fastened into the sidewall 44 at a longitudinal spacing below second fastener 154. The third fastener engages the sidewall 44 at a third holder that is a third cap nut 164, nonrotatably embedded in the sidewall below the positions of the first and second cap nuts. The third cap nut is flush with the sidewall 44 of the back panel 22 so as to present no interference with movement of the slide behind the sidewall 44. The first and second cap nuts are flush with the slide 129 so as to minimize any interference of needed gap 162 between the slide 129 and the sidewall 34 of front cover 24. The spring attached between the second and third fasteners pulls the fasteners toward one another, typically grounding the second fastener at the bottom end of the second keyway slot when the receiver 58 is empty. Placing a pin 68 into receiver seat 60 displaces the receiver upwards toward the top of the sidewall, extending the spring 158 and thereby also raising the second fastener in the second keyway. The resulting spring force holds pin 68 in seat 60.

The back panel 22 and front panel 24 of housing 20 fit together somewhat like a box and a lid, where both panels have sidewalls. FIG. 16 shows a back panel with right sidewall 45 carrying a right slide 128. In order to operate properly with the slide 128 and receiver 58 on sidewall 45, the corresponding sidewall 34 of the front panel is spaced from slide 128. Hatch marks 162 indicate a spacing from sidewall 34 that allows slide 128 to move longitudinally. Pin 68 is selected to have adequate length to extend from sidewall 34 through the spacing 162 to beyond seat 60.

Both engagement and disengagement between pin 68 and seat 60 takes place against the force of the selected spring 158. Either higher or lower tension springs 158 can be selected, while having similar lengths. Spring selection allows the spring-loaded slide method to use a single hardware size over a range of different housings 20 and with different video screens 26. Springs of different lengths can be selected, as well, to the extent the lengths of the keyway slots permit operation with a variety of selected spring lengths.

Housings 20 can be prepared in advance of need according to pre-established size ranges. As in the fixed embodiments of FIGS. 1 and 3, at least a minor factor in suitable sizing arises from the qualities of the chosen material of manufacture, and an interrelated factor arises from the contours of the chosen design. A greater sizing factor arises with availability of mechanical repositioning of locking elements as found in the bolt-down concepts of the fixed mechanical adjustment method shown in FIGS. 13-14. With the spring-loaded slide method of FIGS. 15-17, the automatically available size range can be equal to the fixed mechanical adjustment method.

A further aspect of the invention is an assembly system in which two objects such as the first and second panels form a housing when fastened into a face-to-face junction with preselected separations. Locking members are operated in pairs, as partners, where, initially, a first locking member of a pair operates to enable operation of the second locking member. The first locking member is a positioning member that pre-positions the panels into alignment and also pre-positions a second member of the pair for use. Subsequently, the second locking member of the pair is operated to complete the assembly. Between the partnering of members within a pair, optionally the members are coordinated to place one panel side of the housing assembly in tension and to place the other panel of the assembly in compression. A member is composed of sub-elements sufficient to operate the member, and the division of sub-elements between different components of the assembly may control placement of panels in tension and compression. The assembly system allows tool-free, rapid access by simultaneously overcoming either the locking elements in tension or those in compression to open both locking members of a pair.

A first member of a pair may be composed of an upper receiver 46 and a matched, engageable upper hitch 56. This first member is a positioning member. A second member may be composed of a lower receiver 58 and a matched, engageable lower hitch 68. This second member is a fastening member. A positioning member and a fastening member constitute a partnered pair and are positioned near a common edge of the two panels. This partnered pair may be regarded as the left partnered pair by virtue of being positioned near the left side of the two panels. Another equal partnered pair may be regarded as the right partnered pair by virtue of being positioned near the right side of the two panels. The engagement of a left upper receiver 46 with a left upper hitch 56 starts pre-positioning of the two panels 22, 24. Pre-positioning the two panels prepares them for subsequent engagement of the left bottom receivers 58 and their associated left lower pins 68. This is a two-step process that forms a completed left side lock between the two panels 22, 24. The right partnered pair is simultaneously operated in two steps to complete a right side lock.

The positioning members pre-position one panel with respect to the other. The two panels are aligned in height, as necessary for the lower pins 68 to meet lower threshold points 62 for threshold engagement. The positioning members 46, 56 pre-align the two panels to place the lower pins 68 at thresholds 62, so that the lower pins 68 are in position to be pushed past the threshold points 62 and into seats 60 when sufficient pressure is subsequently applied. Significantly, the positioning member is more than just a fastener located in a chain of fasteners, which to some degree might be considered to position a next in line fastener. Instead, the positioning member creates a relationship in which the downstream fastener can operate, where otherwise it could not operate. For example, without the positioning hitch 56 being first engaged on seat 48, the next downstream hitch 68 could not establish a fastening relationship in next seat 60.

Locking the lower fastening structures 58, 68 also optionally establishes a compression and tension relationship of the two panels. In the example shown in FIGS. 1-8F, the upper seat 48 faces upward and the lower seat 60 faces downward. In this partnered relationship, the upper pin 56 is placed over the upper seat and is drawn downward, while the partnered lower pin 68 is under the lower seat 60 and is drawn upward. To maintain the pins in the seats, intermediate wall 54 of the front panel is neutral or in tension, placing the partnered seats 48, 60 in neutral force or in compression across intermediate wall 44 of the back panel.

The partnered structure is composed of a positioning member and a fastening member at a substantially fixed distance. A partnering between a lower engageable fastener 58, 68 and an upper engageable positioner 46, 56 establishes one partnered pair. The members of the partnered pairs are arranged such that the positioning members are positioned near a common edge of the panels, especially near a top edge where the positioning members can be initially engaged to start the fastening process between two panels 22, 24. The fastening members are positioned near an opposite common edge, especially near a bottom edge where the fastening members are conveniently reached for hand engagement or disengagement.

Two partnered pairs are located at laterally separated positions, such as one pair near the right edge of the panels and one pair near the left edge of the panels. With partnered pairs positioned according to this scheme, the partnered pair near the left edge is formed of a top positioning member and a bottom fastening member and may be regarded as the left hand partnered structure. The partnered pair near the right edge is formed of a different top positioning member and a different bottom fastening member that may be regarded as the right hand partnered structure.

The positioning members and the fastening members may be identical or closely similar in configuration. They may primarily differ in manner of usage rather than in configuration. As an example of this difference applied to a back panel 22, a top positioning structure 46 and a bottom fastening structure 58 both appear to define almost the same structure, except that the top elements 48, 50, 52 form an upwardly open structure for receiving a pin 56, while the corresponding bottom fastening elements 60, 62, 64 form a downwardly open structure for receiving pin 68. Thus, the top and bottom elements 46 and 58 are near inverted versions of one another. The open top of element 46 initially functions as a hook or hinge, at first receiving a hand-placed matching top pin 56 from the front panel to loosely draw-in, pre-position, and attach the top of the front panel 24 to the top of the back panel 22. The open bottom of element 58 operates differently when it subsequently receives a pin 68 from the front panel 24, with the bottom pin 68 first being forced past an interference point at threshold 62 while wall 54 applies tension to push pin 68 toward seat 60, simultaneously applying force that retains upper pin 56 in seat 48.

Where the back panel 22 carries top and bottom seats 48, 60, the two seats are located at the same side edge, such as the left edge of the back panel. In an example where the display housing is regarded as mounted with top and bottom ends positioned in vertical orientation, the chosen edge to be described is the left side edge, the right side edge being similar, mutatis mutandis. One seat 48 is at the left side top position of the back panel and the other seat 60 is at the left side bottom position. The two left side seats 48, 60 may be formed integrally with the material of the back panel sidewall 44. For example, if the back panel is formed of sheet metal, the same body of sheet metal may form the sidewall 44 and be bent forward at the left side edge of the back panel 22 to form the left sidewall 44, which is positioned perpendicular to the central area of the back panel, extending forward from the back panel. In this description, "forward" means toward the front panel. The left sidewall is formed to include the two seats, one near a higher point on the left sidewall and one near a lower point on the left sidewall. The top positioned seat 48 is a positioning structure at top left position; and the bottom positioned fastening seat 60 is a member of a fastening structure at bottom left position. The top positioned seat is at a preselected height relative to the rear panel and is connected to a relatively higher front threshold 50 located forward of the seat and optionally interconnected by a wall 52 that slopes from the high threshold 50 to the seat 48. The bottom positioned fastener 58 is approximately inverted with respect to the described top surfaces. The bottom positioned seat 60 also is at a preselected height relative to the rear panel and is connected to a front lower threshold 62 located forward of the seat and interconnected by a wall 64 that slopes from the higher seat position to the lower threshold 62. Where the left sidewall 44 extends between the two left side seats, this portion 44 of the sidewall acts as an interconnecting and spacing web that resists displacement of either seat 48, 60 toward the other. The interconnecting web 44 also is a portion of the back panel 22 that optionally is placed in compression when the display housing is assembled by placement of pins 56, 68 in their respective seats.

According to another aspect of the invention, a display housing is formed of a generally planar back panel 22 and front panel 24, aligned face-to-face. The back panel forms two seats, which are hinge seat 46, and clip seat 58 that are mounted perpendicularly to a face of the panel 22 at one side edge 44 of the back panel, such as the left side edge.

A top edge of the first, hinge seat 46 is open for receiving a complementary hinge pin 56 that is the upper member of a linked pair of pins 56, 68. The first, hinge seat 46 is formed with an entry end 50 at a relatively more removed spacing from the back panel and a concluding end 48 forming a first end stop at a relatively less removed spacing from the back panel.

A bottom edge of the second, clip seat 58 is open for receiving a complementary lower pin 68 that is the second member of the linked pair of pins 56, 68. The second seat 58 is formed with an entry end 62 at a relatively more removed spacing from the back panel and a concluding end 60 forming an end stop at a relatively less removed spacing from the back panel 22. A first preselected distance separates the entry end 50 of seat 46 from the entry end 62 of seat 58. A second preselected distance separates the concluding end 48 of seat 46 from the concluding end 60 of seat 58. The first preselected distance between points 50 and 62 is different from the second preselected distance between points 48 and 60. The distance 54, FIGS. 8A-8E, separating first and second members of the linked pair of hitches 56, 68 can be equal to the second preselected distance 48-60, thereby placing the pins 56, 68 at concluding ends 48, 60 with neutral force.

The sloped positions and relative heights of the walls 52, 64 and entry threshold points 50, 62 can be described in functional terms. The entry end of the receivers is a threshold 50, 62 that is offset above the level of the stop 48, 60 at the open side edge of the receivers, and the inclined wall 52, 64 extends from the thresholds to the stops. The end stop of the receivers 46, 58 is the functional low end of the inclined wall. Between the functional high end and the functional low end, the complementary hitches 56, 68 follow the functional declines until stopped at the end stops 48, 60 or other functional low end. The receivers are used in an opposed pair that has oppositely facing open side edges, such as the two open edges facing up and down. The receivers 46, 58 are formed of sheet material with a coplanar web 44 of the same sheet material disposed between the two receivers. The web 44 is coplanar with the receivers and, as such, supports the two receivers at a fixed separation. On the front panel 24 of the display housing, the mating hitches are mounted to allow deflection or displacement from alignment of the complementary hitch 68 so that it can enter the open side of the lower receiver by forced deviation from alignment to pass over the threshold 62.

With reference to FIGS. 1-7 the back panel 22 is configured to carry a video display screen 26. A display carrier 70 is mounted directly to the back panel 22 at a central location. With reference to the detailed view of FIG. 4, the carrier has opposite sidewalls and includes a hinge rod 72 mounted between the sidewalk of the carrier 70, on which the video display screen 26 can be hung, as suggested by arrow 73 of FIG. 3. The video display screen is configured to carry a TV mounting bracket 74 on its rear face 76 that includes hooks 78 sized and positioned to engage the hinge rod 72 of the carrier 70. The bracket 74 can be applied to the rear 76 of the video display screen using four socket head screws 80 spaced in accordance with known video screen mounting standards, such as VESA standards. When the video display screen has been installed on the back panel 22, the front panel 24 is attached to the back panel 22, with the video display screen 26 positioned to be viewable through the viewing window 28. The position of the video display screen is adjustable on the back panel 22 by shifting the carrier 70 to establish alignment of the screen 26 with the viewing window 28. One arrangement for permitting the carrier 70 to shift is to apply mounting bolts 82 through elongated adjustment slots 84 in the carrier and then to shift the carrier as necessary in the elongated slots to align the screen. The bolts can be tightened by using wing nuts 86, thereby fixing the position of the carrier on the front face of the back panel.

Figure 3:
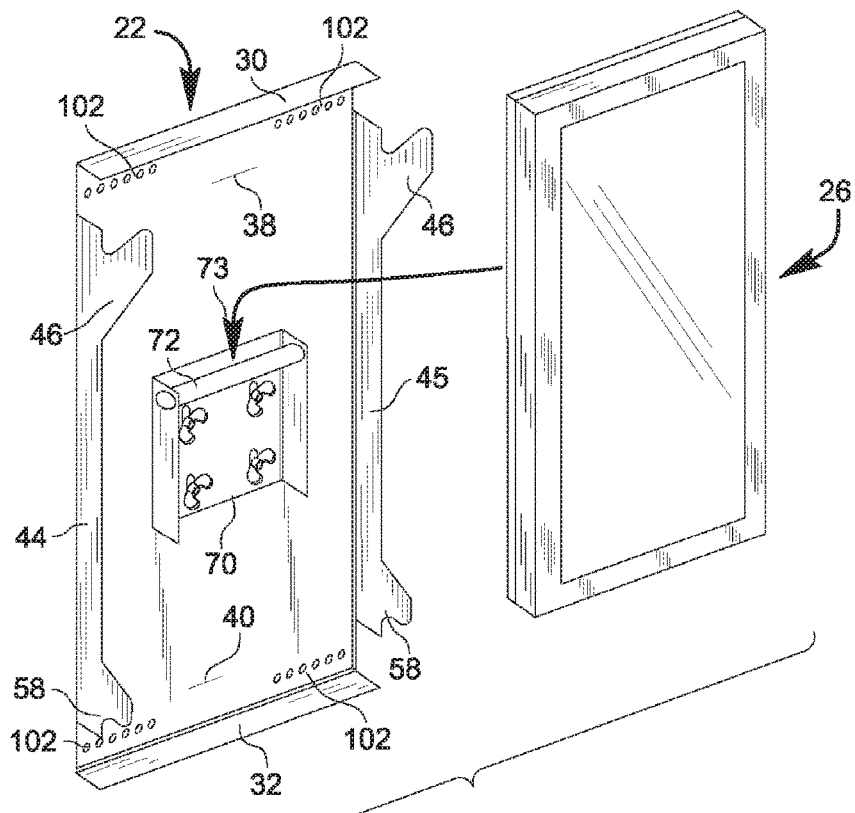
FIG. 3 is an isometric assembly view taken from a front, upper left viewpoint, of said mounting panel of FIG. 1 and said video screen of FIG. 2, with an assembly arrow suggesting pre-assembly movement between the respective carrier and mating hanger of the two.
Figure 4:
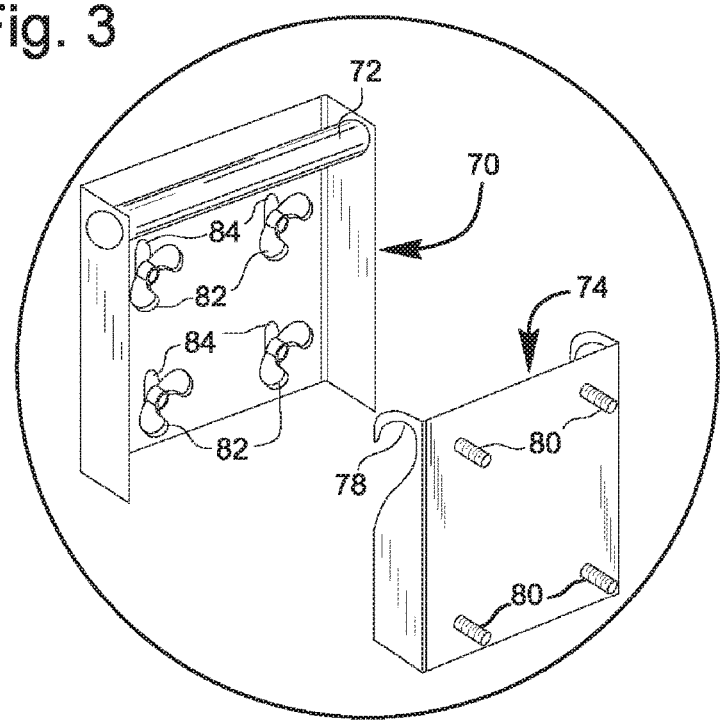
FIG. 4 is an enlarged detail view of said carrier of FIG. 1 and said mating hanger of FIG. 2, shown in pre-assembly positions similar to FIG. 3 with remainders of said rear mounting panel and said video screen deleted for clarity.

As best seen in FIGS. 3 and 6, the front panel 24 is applied to the back panel 22 over the mounted video display screen 26. The front panel is formed of a front wall 88 that fits over the perimeter of the video display screen 26 to hold the video display screen within the display housing 20. From outer edges of front wall 88, right and left sidewalk 34, 36, top sidewall 30, and a bottom sidewall 32 depend and fit around the back panel 22, inclusive of sidewalk 44 and receivers 46, 58 of the back panel. The sidewalk 34, 36 of the front panel carry engaging hitches that engage the receivers 46, 58 as previously described and function similarly to the examples employing pins 56, 68. The pins 56, 68 are equal in number and position to the receivers 46, 58 of the back wall, as previously described. The pins 56, 68 are arranged to include, for example, a top pair of pins 56 and a bottom pair of pins 68, also separated into a right hand pair and a left hand pair. A suitable pin mounting is to sidewall 34 or 36 of the front panel 24 in a transverse orientation to fit across the receivers 46, 58. The spacing of the pins in front-to-back depth on sidewalls 34, 36 is determined by the proposed degree of engagement of the front panel over the back panel. As suggested by FIG. 6, the pins wall be engaged over receivers 46, 58 in seats 48, 60. The seats are at a preselected forward distance from back panel 22, and the pins 56, 68 are at a preselected rearward distance behind front panel wall 88. Thus, with the pins located at the seats 48, 60, the front-to-back depth of pin position on sidewalls 34, 36 determines how far the front panel sidewalls 34, 36 overlap the back panel sidewalk 44 at least with respect to seats 48, 60. Prior to the point of full assembly, but with the top pair of right and left pins 56 fully engaged at the right and left seats 48 on the receivers 46, the bottom pair of right and left pins 68 is positioned at the thresholds 62 of the bottom pair of right and left receivers 58, as previously described. Assembly of the display housing 20 is completed by first hooking the top pair of pins 58 over the top receivers 46 to pre-position the two panels for final assembly, and then pressing the front panel 24 toward the back panel 22 by hand pressure, as suggested by the hand images 96 and motion arrows 69 in FIG. 6, forcing the lower pair of pins 68 past the thresholds 62 at the entry position of the lower pair of receivers. The lower pins 68 will then move into the seats 60 or other end stops at the back ends of the receivers 58, completing assembly of the display housing 20.

As best seen in FIG. 1, the upper receivers 46 extend forward from wall 44 by a selected distance. The lower receivers 58 extend forward by a smaller selected distance. This size difference reflects the difference in function, where the front panel is placed by hand over the larger receivers 46. The larger receivers 46 are desirable when the engagement is made by hand. The lower receivers 58 benefit from the hand engagement of the upper elements because the lower receivers become pre-aligned, requiring only a direct push to complete the fastening. Due to the pre-alignment, the smaller lower fasteners 58 are adequate for completing the fastening. The use of larger and smaller receivers can be applied to other orientations of the front and back panels, using the larger fasteners for the end of the display housing that will be directly engaged by hand.

With reference to FIGS. 5, 7 and 8C-E, the display housing 20 can be opened by hand, without requiring any tools. From a starting position of FIG. 8C where the housing 20 is fully assembled, opening the housing begins at FIG. 8D by forcing lower pin 68 forward from seat 60 and past threshold 62. Hand-pulling the bottom of the front panel, as suggested by hand images 98 and arrow 99 of FIG. 7, frees the lower pins 68 from the lower receivers 58, bringing pins 68 to the position of FIG. 8D. The bottom wall 32 of the front panel 24 has openings or recesses serving as finger grips 100, FIG. 5, to aid in the hand-pulling of the front panel. When the bottom fasteners have been pulled open, the pins 56 of the positioning members at the top of the housing can be easily lifted from seat 48, as suggested by arrow 77 of FIG. 8D. Lifting the pins 56 from the similarly located upper receivers 46 brings the upper pin 56 to the position of FIG. 8E. Then, the front panel 24 can be lifted free of the back panel 22.

Several mounting environments are suitable for employing the display housing 20. As disclosed above, one type of mounting is a vertical mounting, such as on a wall. This mounting can be established by attaching the back panel of the display housing to a vertical wall. The housing may be formed of sheet steel that is heavy enough to resist tampering and forced opening. Such steel can be difficult to mount. As an aid to mounting the back panel, it is configured with an array of pre-formed mounting holes 102 spread across the back panel in both top and bottom rows. A secure wall mounting is especially important to resist pulling the housing free of the wall when pulling forward the front panel to open the housing.

Uniting the front and back panels of the display housing can be understood from a different perspective where the angled fingers serving as receivers 46 and 58 are regarded as hooks in a cramped entry. The joining scheme can be viewed as a snap together function in which fastening members 58 and positioning members 46 are formed by opposed, outside facing hooks, which may include angled ramps 64, 52. The back panel carries a first pair of hooks 46, disposed near the top of the back panel, to the right and left on sidewalk 44 of the back panel 22. The hooks open out to the top of the housing. These first hooks function much like the previously described positioning structures 46. A second pair of hooks 58 are disposed near the bottom of the back panel, to the right and left on sidewalk of the back panel and open to the bottom of the back panel. These second hooks function much like the previously described fastening members 58. In both cases, the hooks are set back from the respective nearest edge, top or bottom, of the housing. The front panel 24 of the housing carries mating hitches configured as transverse pins that are spaced not quite far enough, top to bottom, to be freely engaged in both top and bottom pairs of hooks 46, 58 at the same time. Instead, one pair of pins, such as the top pair 56, must be hooked over the leading ends 50 of the top, upwardly open hooks 46. Once over the leading edge 50, the pins slide on inclined ramps 52 into the top hooks to draw the front panel 24 vertically lower and nearer to the back panel, achieving pre-fastening alignment with the back panel 22. With the pre-alignment, the bottom pins 68 become positioned at the leading or front ends 62 of the bottom hooks 58. In order to enter the bottom hooks, the bottom pair of pins 68 has to flex or otherwise deflect around the leadings ends 62. Once engaged in the bottom hooks, the bottom pins are drawn on incline 64 toward the back panel 22 to complete the assembly. Opening the housing 20 is achieved by pulling out on the bottom wall 32 of the front panel with enough force to again flex the bottom pins 68 to pull back over the leading ends 62 of the bottom hooks.

According to this perspective, the top hooks 46 have a top edge 48, 52, 50 that is angled upwardly from the back panel, forward to the free end 50 of the top hooks, defining a top entry guide or ramp 52. A first pair of pins, likewise, will be a top pair 56 and initially will be hooked over the corresponding top hooks, where the engaged pins slide down the ramp 52, pulling the front frame 24 closer to the back panel assembly 22 and lowering the position of the front frame 24 to align with the back assembly.

The bottom hooks 58 have a bottom edge 60, 64, 62 that is angled downwardly from the back panel, forward to the free end 62 of the bottom hooks, defining a lower entry guide or ramp 64. A second pair of pins 68, likewise, will be a bottom pair that will be aligned with the forward, free ends 62 of the bottom hooks. Due to the inclined angle of the second pair of ramps 64, the second pair of pins 68 is partially blocked from engaging under the entry 62 of the second pair of hooks. In order to complete the assembly, the lower pins must be pushed toward the back panel with sufficient force to cause them to flex while passing under the free ends 62 of the second pair of hooks. The lower pins then are free to spring back to contact the ramps 64. The lower pins are free to slide up the inclined ramp 64 toward the back panel, pulling the bottom of the front panel toward the back panel.

With reference to FIGS. 9-12, another mounting environment is free-standing, such as in a kiosk 104. This type of mounting employs a pedestal 106 that supports a table 108 at its top. The pedestal maintains the table at a chosen angular disposition, such as horizontal or tilted up from horizontal at a convenient acute viewing angle such as 30°, 45°, or some other chosen angle. The display housing 20 is mounted to the table 108 and presents the video display screen 26 at the chosen viewing angle. The mounting may be by a hinge 110 between the bottom of the back panel and the lower end edge of the table 108. A further part of the mounting may be by keyed fasteners 112 between a top portion of the table and a top portion of the back panel of the display housing. A suitable type of keyed lock 112 is a cam lock fastener, which uses a key-controlled rotatable blade fixed to the table to provide security by engaging the rotary blade in front of the back panel to selectively prevent the back panel from lifting away from the table. At the same time, the display housing may be secured together by the receivers 46, 58 and hitches 56, 68 previously described. Other supplemental locks 114 similar to cam lock fasteners can be employed, such as to supplementally secure the front panel to the rear panel or table.

In the environment of a kiosk, several additional features are desirable. One of these is gas springs 116 arranged between the table and the rear panel. When the display housing is pivoted away from the table, the gas springs secure the display housing in the separated position to prevent the display housing from accidentally falling back on the table. Another feature is an NUC PC 118 enclosure or the like, located on the table at a spot with sufficient clearance to the back panel or to the contained video display screen. The NUC PC can supply content to the video display screen. A third feature is a hollow core passage 120 through the height of the pedestal 106, which can pass through the table to supply ventilation airflow into the video display housing 20. To promote cooling airflow, the back panel of the display housing may be ventilated through back panel openings 122 that permit airflow access to the video display screen. The hollow pedestal 120 also is a convenient passage for an electrical connection to the video display screen. A power cord 126 may pass from the video display screen into the pedestal and extend as far as desired. For example, the cord 126 may be routed to an electrical source 124, such as an outlet 124 located anywhere including inside or outside the pedestal. A power cord 126 can be extended out the bottom of the pedestal 106 to an external power outlet or junction box; or external power may be delivered to an outlet or power strip inside the pedestal from an external source. These or other convenient schemes may employ the hollow pedestal as a conduit for power delivery. Thus, the video display screen may provide its own power cord 126 passing into or through the hollow pedestal to reach whatever power connection 124 is employed.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be regarded as falling within the scope of the invention as defined by the claims that follow.

What is claimed is:

1. A display housing transmutable between assembled and disassembled configurations, comprising:
    front and back panels arranged in alternative assembled or disassembled configurations, when in said assembled configuration forming an interior chamber therebetween, said front panel defining a front viewing window visually accessing said interior chamber;
    a first fastener array on a first of said front and back panels and a second fastener array on a second of said front and back panels, facing one another when the panels are in the assembled configuration, said first and second fastener arrays being in positions aligned to engage between the front and back panels to unite the front and back panels into the assembled configuration;
    the first fastener array is formed of a pair of upper hitches arranged in upper left and right side positions on said first panel, and a pair of lower hitches arranged in lower left and right side positions on the first panel;
    the second fastener array is formed of a pair of upper receivers arranged in upper left and right side positions on said second panel with each having an upward opening, and a pair of lower receivers arranged in lower left and right side positions on the second panel with each having a downward opening;
    said upper left and right hitches of the first fastener array are positioned to enter said respective upper left and right receivers at said upward openings, establishing a junction of known distance to said lower hitches and to said downward openings of said lower receivers, wherein the known distances between the downward openings and the lower hitches establishes an interference fit wherein the position of the lower receivers interferes with clear entry of the lower hitches into the downward openings of the lower receivers; and
        a height adjustable slide connected to a lower receiver, the height adjustment modifying said interference fit.

2. The display housing of claim 1, further comprising:
    an adjustable compression fastener operating between said second housing panel and said slide to modify said interference fit; and
    a keyway slot defined in the second housing panel and carrying said adjustable compression fastener.

3. The display housing of claim 1, further comprising:
    a spring connected between said slide and said second panel such that changes in the length of said spring correspondingly change said distance between said junction and said downward openings of the lower receivers; and
    a spring mover altering the length of the spring in response to changes in closeness of said first panel to the second panel at the lower receivers.

4. The display housing of claim 3, wherein:
    said spring mover comprises a top edge on said lower receivers, sloped and positioned to force a change in said distance between said junction and said downward openings of the lower receivers in response to changes in closeness of said first panel to the second panel at the lower receivers.

5. The display housing of claim 1, wherein:
    said first housing panel is said front panel;
    said second housing panel is said back panel; and
    said upper and lower pairs of hitches are arranged laterally of said front viewing window.

6. A display housing transmutable between an open configuration and a closed configuration, comprising:
    a front housing panel and a back housing panel arranged in alternative closed or open housing configurations, each panel having upper and lower ends and right and left sides, and when in said closed configuration defining a closed interior chamber configured, in use, to contain a flat panel display, said front panel defining a viewing window visually accessing said interior chamber;
    a transverse upper hitch and a transverse lower hitch on a first of said front and back housing panels, said transverse upper hitch and said transverse lower hitch being separated by a known spacing;
    an upper receiver disposed at an upper position on said housing, on a second of said front and back housing panels, carrying a top seat for receiving an upper hitch when the housing is in closed configuration;
    a lower receiver disposed at a lower position on the housing, carrying a bottom seat for receiving said lower hitch when the housing is in closed configuration;
    a slide mounted on said second housing panel, carrying one of said lower receivers, longitudinally moveable during transmutation of the housing from open to closed configuration over a path of travel oriented between upper and lower positions on the second housing panel;
    wherein, said path of travel includes a first point where, with respect to said known hitch spacing, said carried bottom seat receives said hitch, and the path of travel includes a second point where the carried bottom seat is closed to receiving the hitch;
    a spring acting between said slide and the second housing panel, in a position biasing the slide to the second point;
    a slide mover positioned to be applied against the first panel during transmutation of the housing from open to closed configuration, moving the slide to the first point;
    whereby the seat on the receiver carried on the slide receives the hitch when the housing is closed.

* * * * *